United States Patent [19]

Hyatt

[11] Patent Number: 4,870,559
[45] Date of Patent: Sep. 26, 1989.

[54] INTELLIGENT TRANSDUCER

[76] Inventor: Gilbert P. Hyatt, P.O. Box 4584, Anaheim, Calif. 92803

[21] Appl. No.: 342,579

[22] Filed: Jan. 25, 1982

Related U.S. Application Data

[60] Continuation-in-part of Ser. No. 191,566, Sep. 29, 1980, Pat. No. 4,445,776, which is a division of Ser. No. 950,901, Oct. 12, 1978, Pat. No. 4,225,225, which is a continuation-in-part of Ser. No. 879,293, Nov. 24, 1969, abandoned, which is a continuation of Ser. No. 101,881, Dec. 28, 1970, abandoned, and a continuation of Ser. No. 134,958, Apr. 19, 1971, abandoned, and a continuation of Ser. No. 135,040, Apr. 19, 1971, and a continuation of Ser. No. 229,213, Apr. 13, 1972, Pat. No. 3,820,894, and a continuation of Ser. No. 230,872, Mar. 1, 1972, Pat. No. 4,531,182, and a continuation of Ser. No. 232,459, Mar. 7, 1972, Pat. No. 4,370,720, and a continuation of Ser. No. 246,867, Apr. 24, 1972, Pat. No. 4,310,878, and a continuation of Ser. No. 288,247, Sep. 11, 1972, Pat. No. 4,121,284, and a continuation of Ser. No. 291,394, Sep. 22, 1972, Pat. No. 4,396,976, and a continuation of Ser. No. 302,771, Nov. 1, 1972, abandoned, and a continuation of Ser. No. 325,933, Jan. 22, 1973, Pat. No. 4,019,540, and a continuation of Ser. No. 325,941, Jan. 22, 1973, Pat. No. 4,060,848, and a continuation of Ser. No. 366,714, Jun. 4, 1973, Pat. No. 3,986,022, and a continuation of Ser. No. 727,330, Sep. 27, 1976, abandoned, which is a continuation of Ser. No. 339,688, Mar. 9, 1973, abandoned, and a continuation of Ser. No. 402,520, Oct. 1, 1973, Pat. No. 4,825,364, and a continuation of Ser. No. 476,743, Jun. 5, 1974, Pat. No. 4,364,110, and a continuation of Ser. No. 752,751, Dec. 20, 1976, Pat. No. 4,120,583, and a continuation of Ser. No. 752,240, Dec. 20, 1976, abandoned, said Ser. No. 342,579, is a continuation-in-part of Ser. No. 889,301, Mar. 23, 1978, Pat. No. 4,322,819, which is a continuation-in-part of Ser. No. 366,714, Jun. 4, 1973, Pat. No. 3,986,022, and a continuation-in-part of Ser. No. 490,816, Jul. 22, 1974, Pat. No. 4,209,853, and a continuation-in-part of Ser. No. 522,559, Nov. 11, 1974, Pat. No. 4,209,852, and a continuation-in-part of Ser. No. 550,231, Feb. 14, 1975, Pat. No. 4,209,843, and a continuation-in-part of Ser. No. 727,330, Sep. 27, 1976, abandoned, and a continuation-in-part of Ser. No. 730,756, Oct. 7, 1976, abandoned, and a continuation-in-part of Ser. No. 754,660, Dec. 27, 1976, Pat. No. 4,486,850, and a continuation-in-part of Ser. No. 752,240, Dec. 20, 1976, abandoned, and a continuation-in-part of Ser. No. 801,879, May 31, 1977, Pat. No. 4,144,582.

[51] Int. Cl.⁴ .............................................. G05B 19/02
[52] U.S. Cl. .................................... 364/130; 318/640; 364/182; 364/572
[58] Field of Search ............... 364/130, 167, 174, 183, 364/474, 182, 550, 551, 572, 474.37, 551.02; 318/640, 592–595

[56] References Cited

U.S. PATENT DOCUMENTS 2,656,106 10/1953 Stabler .
(List continued on next page.)

FOREIGN PATENT DOCUMENTS 1240882 7/1971 United Kingdom .

OTHER PUBLICATIONS

Boysel—"Adder on a Chip:LSI Helps Reduce Cost of
(List continued on next page.)

Primary Examiner—Joseph Ruggiero
Attorney, Agent, or Firm—Gilbert P. Hyatt

[57] ABSTRACT

A high precision transducer and a system related thereto are provided for achieving high precision in an efficient, economical, and small size configuration. In a preferred embodiment, an optical position encoder transducer utilizes an optically sensed code wheel in combination with a vernier optical split to achieve high precision. Code wheel positions are sensed photo-optically to provide the most significant bits of the encoder position number. Optical slit position is sensed photo-optically to interpolate between disk code positions and to provide a high precision vernier to generating the least significant bits of the encoder output number. Anti-ambiguity circuitry resolves ambiguity between code wheel positions, vernier positions, and alignment. An array of photosensors provides enhanced precision and economy. Systems utilizing such transducers include digital readout systems, machine control systems, and data logging systems.

29 Claims, 6 Drawing Sheets

U.S. PATENT DOCUMENTS

| | | |
|---|---|---|
| 2,747,797 | 5/1956 | Beaumont . |
| 2,897,638 | 8/1959 | Maker . |
| 3,110,865 | 11/1963 | Scuitto . |
| 3,122,691 | 2/1964 | Centner et al. . |
| 3,123,657 | 3/1964 | Clark, Jr. et al. . |
| 3,142,820 | 7/1964 | Daniels . |
| 3,174,367 | 3/1965 | Lukens . |
| 3,178,563 | 4/1965 | Wedgewood et al. . |
| 3,187,321 | 6/1965 | Kemeny . |
| 3,283,129 | 11/1966 | Kelling . |
| 3,308,279 | 3/1967 | Kelling . |
| 3,312,884 | 4/1967 | Gabor . |
| 3,315,235 | 4/1967 | Carnevale et al. . |
| 3,323,030 | 5/1967 | Inaba et al. ............ 318/640 X |
| 3,324,458 | 6/1967 | MacArthur . |
| 3,346,853 | 10/1967 | Koster . |
| 3,349,229 | 10/1967 | Evans . |
| 3,389,404 | 6/1968 | Koster . |
| 3,394,293 | 7/1968 | Taniguchi et al. ......... 318/640 X |
| 3,406,379 | 10/1968 | Palevsky . |
| 3,453,549 | 7/1969 | Payne et al. . |
| 3,462,742 | 8/1969 | Miller et al. ............ 364/200 |
| 3,465,298 | 9/1969 | Duke et al. . |
| 3,513,371 | 5/1970 | Hoppe ................. 318/594 |
| 3,548,172 | 12/1970 | Centner et al. . |
| 3,555,516 | 1/1971 | Proctor . |
| 3,566,365 | 2/1971 | Rawson . |
| 3,569,814 | 3/1971 | Rosenberg . |
| 3,573,738 | 4/1971 | Bottles et al. . |
| 3,576,978 | 5/1971 | Rosenberg . |
| 3,582,749 | 6/1971 | Wenzel . |
| 3,584,284 | 6/1971 | Beach et al. ............ 318/594 X |
| 3,587,044 | 6/1971 | Jenkins . |
| 3,590,355 | 6/1971 | Davis et al. ............. 318/593 X |
| 3,593,091 | 7/1971 | Ross . |
| 3,593,313 | 7/1971 | Tomaszewski . |
| 3,596,256 | 7/1971 | Alpert . |
| 3,599,004 | 8/1971 | Grendelmeier . |
| 3,602,994 | 9/1971 | Layman . |
| 3,612,841 | 10/1971 | Kosem et al. . |
| 3,626,266 | 12/1971 | Sindelar et al. . |
| 3,626,385 | 12/1971 | Bouman . |
| 3,629,560 | 12/1971 | Slawson . |
| 3,633,011 | 1/1972 | Bederman et al. . |
| 3,634,662 | 1/1972 | Slawson . |
| 3,634,664 | 1/1972 | Valek . |
| 3,636,525 | 1/1972 | Inaba et al. . |
| 3,646,522 | 2/1972 | Furman . |
| 3,656,377 | 4/1972 | Kosem . |
| 3,665,493 | 5/1972 | Glowzewski . |
| 3,668,503 | 6/1972 | Lindner . |
| 3,668,653 | 6/1972 | Fair et al. . |
| 3,670,228 | 6/1972 | Crosby ................ 318/594 |
| 3,671,727 | 6/1972 | Rhoades . |
| 3,684,873 | 8/1972 | Meyer et al. . |
| 3,685,022 | 8/1972 | Raynes . |
| 3,686,556 | 8/1972 | Anger et al. . |
| 3,686,639 | 8/1972 | Fletcher et al. . |
| 3,699,317 | 10/1972 | Middleditch . |
| 3,701,888 | 10/1972 | McDaniel . |
| 3,702,988 | 11/1972 | Haney ................ 364/200 |
| 3,714,448 | 1/1973 | Cronan . |
| 3,715,938 | 2/1973 | Ledergerber et al. . |
| 3,720,120 | 3/1973 | Cutler . |
| 3,731,177 | 5/1973 | Commander et al. . |
| 3,739,158 | 6/1973 | Woodward . |
| 3,745,532 | 7/1973 | Erwin . |
| 3,746,845 | 7/1973 | Henegar et al. . |
| 3,757,128 | 9/1973 | Vermeulan . |
| 3,818,303 | 6/1974 | Rossel . |
| 3,902,063 | 8/1975 | Oelsch et al. . |
| 4,100,420 | 7/1978 | Metcalf et al. . |
| 4,209,843 | 6/1980 | Hyatt ................. 364/724 |
| 4,209,852 | 6/1980 | Hyatt ................. 365/222 |
| 4,310,878 | 1/1982 | Hyatt ................. 364/183 |
| 4,335,306 | 6/1982 | Gort et al. . |
| 4,370,720 | 1/1983 | Hyatt ................. 364/474 |
| 4,396,976 | 8/1983 | Hyatt ................. 364/167 |
| 4,471,385 | 9/1984 | Hyatt ................. 358/230 |
| 4,486,850 | 12/1984 | Hyatt ................. 364/747 |
| 4,523,290 | 6/1985 | Hyatt ................. 364/602 |
| 4,531,182 | 7/1985 | Hyatt ................. 364/131 |
| 4,825,364 | 4/1989 | Hyatt ................. 364/200 |

OTHER PUBLICATIONS

'Small Machine"—*Electronics*, Mar. 18, 1968, pp. 119–124.

Hopkins—"Electronic Navigator Charts Man's Path to the Moon"—*Electronics*, Jan. 9, 1967, pp. 109–118.

Levy et al.—"System Utilization of Large Scale Integration"—Oct. 1967, *IEEE Trans. on Electronic Computers*, vol. EC-16, pp. 562–566.

Beelitz et al.—"System Architecture for Large Scale Integration"—AFIPS Conf. Pro., vol. 31—pp. 185–200, Nov. 1967.

(List continued on next page.)

OTHER PUBLICATIONS

Koster: "A Stored Program Display Console: Bunker Ramo Model 90", Sixth National Symposium on Information Display; Society for Information Display, 1965.

Bauer et al.: "DODDAC—An Integrated System for Data Processing, Interrogation, and Display"; Proceedings of the Eastern Joint Computer Conf.; Dec. 12–14, 1961.

Booth and Booth; Automatic Digital Calculations, (1953).

Computerized NC-A Step Toward the Automated Factory, by Budzilovich, Control Engineering, Jul. 1969, pp. 62–68.

Microprogramming Handbook by Microdata, 1971, pp. 208, 278 and 279.

"Three Machine Tool Shows–or Were They Control Show?" in Control Engineering, Nov. 1970; pp. 53–56.

Mesinaeff, P. G.; "The Technical Ins and Outs of Computerized Numerical Control" in Control Engineering, Mar. 1971; pp. 65–84.

"Microprogrammable Digital Computer" by Micro Systems Inc., Computer Design, May 1969, p. 69.

"Introduction to Microprogramming Concepts" by Micro Systems Inc., 14 pages, Apr. 18, 1969.

Miller–"Microcircuits Boost Minuteman Capability", Aviation Week and Space Tech., Oct. 1963, pp. 70–87.

Potter et al.–"Integrated Scratch Pads Give New Generation of Computers", Electronics–4/66–pp. 119–126.

Francis et al.; "The Computer Manager Manufacturing Concept", Proceed. of the 7th Annual Meeting and Technical Conf. of Numerical Control Soc., Apr. 8–10, 1970, pp. 229–239.

"Down Links: Instructions and Commands", from Computer Integrated Manufacturing by Harrington, pp. 91–94.

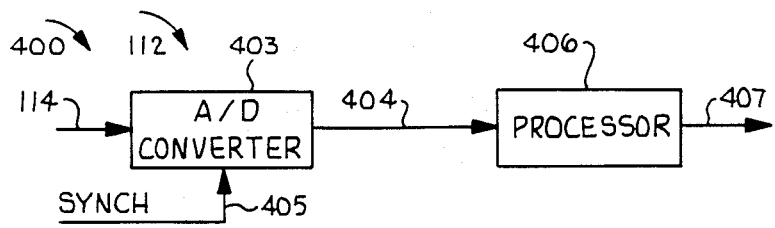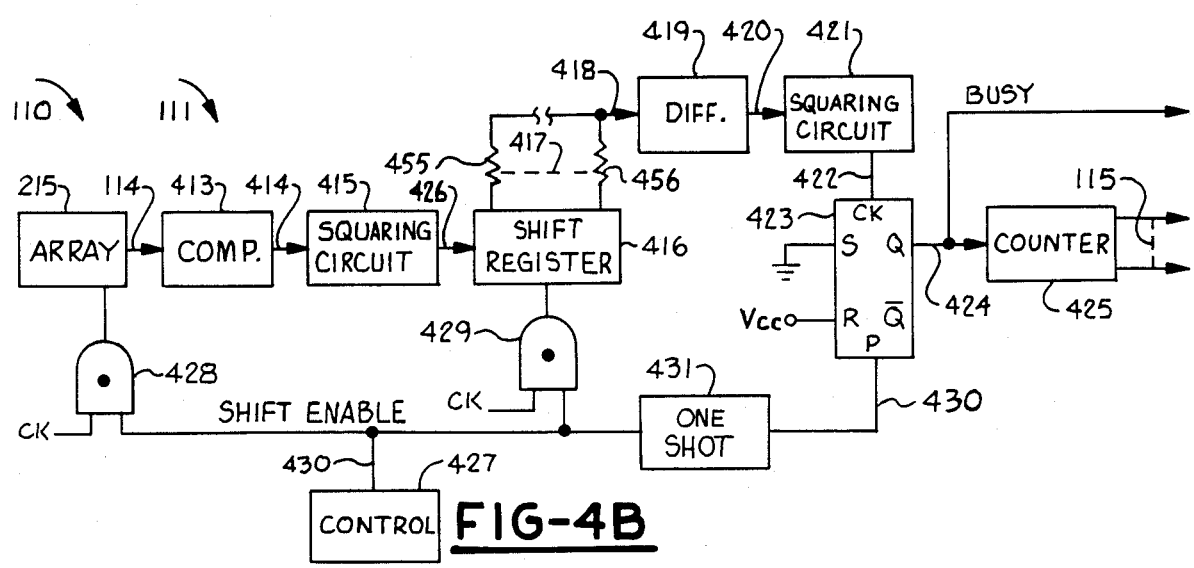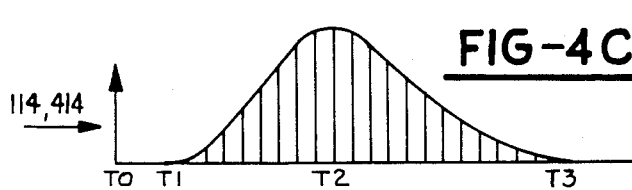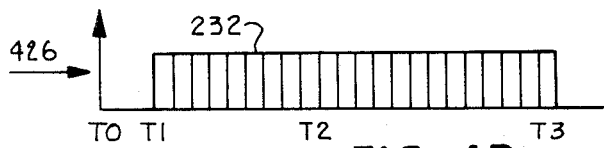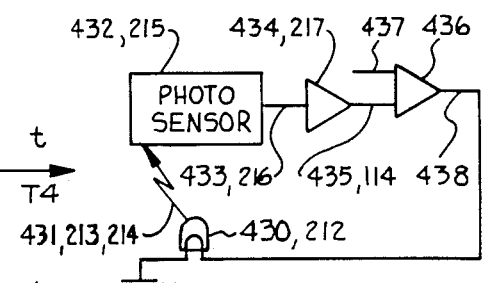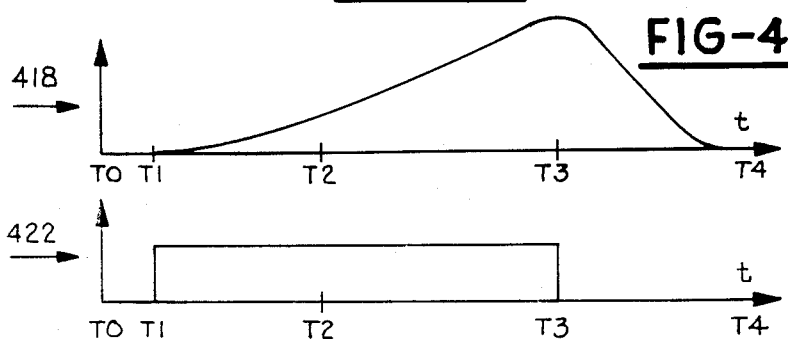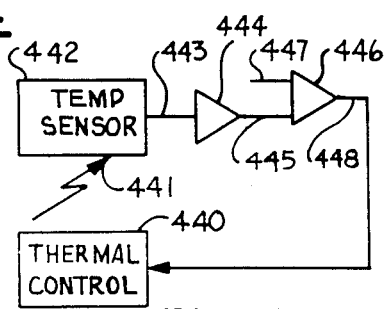

INTELLIGENT TRANSDUCER

CROSS REFERENCE TO RELATED APPLICATIONS

The instant application is a continuation-in-part of copending parent application HIGH REGISTRATION PHOTOMASK MACHINE AND COMPUTERIZED NUMERICAL CONTROL SYSTEM Ser. No. 191,566 filed on Sept. 29, 1980 now U.S. Pat. No. 4,445,776 issued on May 1, 1984 which is a divisional of grandparent application HIGH REGISTRATION PHOTOMASK MACHINE AND COMPUTERIZED NUMERICAL CONTROL SYSTEM Ser. No. 950,901 filed on Oct. 12, 1978 now U.S. Pat. No. 4,225,225 issued on Sept. 30, 1980; which grandparent application is a continuation-in-part of great-grandparent applications METHOD AND APPARATUS FOR PROCESSING THE DIGITAL OUTPUT OF AN INPUT MEANS Ser. No. 879,293 filed on Nov. 24, 1969 now abandoned in favor of a continuing application;

FACTORED DATA PROCESSING SYSTEM FOR DEDICATED APPLICATIONS Ser. No. 101,881 filed on Dec. 28, 1970 now abandoned in favor of continuing application;

CONTROL SYSTEM AND METHOD Ser. No. 134,958 filed on Apr. 19, 1971 abandoned;

CONTROL APPARATUS Ser. No. 135,040 filed on Apr. 19, 1971;

APPARATUS AND METHOD FOR PRODUCING HIGH REGISTRATION PHOTO-MASKS Ser. No. 229,213 filed Apr. 13, 1972 now U.S. Pat. No. 3,820,894 issued on June 28, 1974;

MACHINE CONTROL SYSTEM OPERATING FROM REMOTE COMMANDS Ser. No. 230,872 filed on Mar. 1, 1972 now U.S. Pat. No. 4,531,182 issued on July 23, 1985;

COORDINATE RESOLUTION FOR NUMERICAL CONTROL SYSTEMS Ser. No. 232,459 filed on Mar. 7, 1972 now U.S. Pat. No. 4,370,720 issued on Jan. 25, 1983;

DIGITAL FEEDBACK CONTROL SYSTEM Ser. No. 246,867 filed on Apr. 24, 1972 now U.S. Pat. No. 4,310,878 issued on Jan. 12, 1982;

COMPUTERIZED SYSTEM FOR OPERATOR INTERACTION Ser. No. 288,247 filed on Sept. 11, 1972 now U.S. Pat. No. 4,121,284 issued on Oct. 17, 1978;

A SYSTEM FOR INTERFACING A COMPUTER TO A MACHINE Ser. No. 291,394 filed on Sept. 22, 1972 now U.S. Pat. No. 4,396,976 issued on Aug. 2, 1983;

DIGITAL ARRANGEMENT FOR PROCESSING SQUAREWAVE SIGNALS Ser. No. 302,771 filed on Nov. 1, 1972 abandoned;

APPARATUS AND METHOD FOR PROVIDING INTERACTIVE AUDIO COMMUNICATION Ser. No. 325,933 filed on Jan. 22, 1973 now U.S. Pat. No. 4,016,540 issued on Apr. 5, 1977;

ELECTRONIC CALCULATOR SYSTEM HAVING AUDIO MESSAGES FOR OPERATOR INTERACTION Ser. No. 325,941 filed on Jan. 22, 1973 now U.S. Pat. No. 4,060,848 issued on Nov. 29, 1977;

ILLUMINATION CONTROL SYSTEM Ser. No. 366,714 filed on June 4, 1973 now U.S. Pat. No. 3,986,022 issued on Oct. 12, 1976;

ILLUMINATION SIGNAL PROCESSING SYSTEM Ser. No. 727,330 filed on Sept. 27, 1976 and now abandoned in favor of continuing applications;

CONTROL SYSTEM AND METHOD Ser. No. 339,688 filed on Mar. 9, 1973 now abandoned;

MONOLITHIC DATA PROCESSOR WITH MEMORY REFRESH Ser. No. 402,520 filed on Oct. 1, 1973 now U.S. Pat. No. 4,825,364 issued on Apr. 25, 1989;

COMPUTERIZED MACHINE CONTROL SYSTEM Ser. No. 476,743 filed on June 5, 1974 now U.S. Pat. No. 4,364,110 issued on Dec. 14, 1982;

HIGH REGISTRATION PHOTOMASK METHOD AND APPARATUS Ser. No. 752,751 filed on Dec. 20, 1976 now U.S. Pat. No. 4,120,583 issued on Oct. 17, 1978; and MEANS AND METHOD FOR COMPUTERIZED SOUND SYNTHESIS Ser. No. 752,240 filed on Dec. 20, 1976 now abandoned in favor of continuing applications: and the instant application is further a continuation-in-part of copending parent application Ser. No. 889,301 filed on Mar. 23, 1978 entitled MEMORY SYSTEM HAVING SERVO COMPENSATION now U.S. Pat. No. 4,322,819 issued on Mar. 30, 1982, which parent application is a continuation-in-part of grandparent applications ILLUMINATION CONTROL SYSTEM Ser. No. 366,714 filed on June 4, 1973 now U.S. Pat. No. 3,986,022 issued on Oct. 12, 1976;

HOLOGRAPHIC SYSTEM FOR OBJECT LOCATION AND IDENTIFICATION Ser. No. 490,816 filed on July 22, 1974 now U.S. Pat. No. 4,209,853 issued on June 24, 1980;

SIGNAL PROCESSING AND MEMORY ARRANGEMENT Ser. No. 522,559 filed on Nov. 11, 1974 now U.S. Pat. No. 4,209,852 issued on June 24, 1980;

METHOD AND APPARATUS FOR SIGNAL ENHANCEMENT WITH IMPROVED DIGITAL FILTERING Ser. No. 550,231 filed on Feb. 14, 1975 now U.S. Pat. No. 4,209,843 issued on June 24, 1980;

ILLUMINATION SIGNAL PROCESSING SYSTEM Ser. No. 727,330 filed on Sept. 27, 1976 now abandoned in favor of continuing applications;

PROJECTION TELEVISION SYSTEM USING LIQUID CRYSTAL DEVICES Ser. No. 730,756 filed on Oct. 7, 1976 now abandoned in favor of continuing applications;

INCREMENTAL DIGITAL FILTER Ser. No. 754,660 filed on Dec. 27, 1976 now U.S. Pat. No. 4,486,850 issued on Dec. 4, 1984;

MEANS AND METHOD FOR COMPUTERIZED SOUND SYNTHESIS Ser. No. 752,240 filed on Dec. 20, 1976 now abandoned in favor of continuing applications;

VOICE SIGNAL PROCESSING SYSTEM Ser. No. 801,879 filed on May 31, 1977 now U.S. Pat. No. 4,144,582 issued on Mar. 13, 1979;

ANALOG READ ONLY MEMORY Ser. No. 812,285 filed on July 1, 1977 now U.S. Pat. No. 4,371,953 issued on Feb. 1, 1983;

DATA PROCESSOR ARCHITECTURE Ser. No. 844,765 filed on Oct. 25, 1977

HIGH INTENSITY ILLUMINATION CONTROL SYSTEM Ser. No. 860,277 filed on Dec. 13, 1977;

ELECTRO-OPTICAL ILLUMINATION CONTROL SYSTEM Ser. No. 860,278 filed on Dec. 13, 1977 now U.S. Pat. No. 4,471,385 issued on Sept. 11, 1984; and which applications Ser. No. 860,277 and Ser. No. 860,278 are further continuations-in-part of great-grandparent application PROJECTION TELEVISION SYSTEM USING LIQUID CRYSTAL DEVICES Ser. No. 730,756 filed on Oct. 7, 1976 now abandoned in favor of continuing applications, HIGH REGISTRATION PHOTOMASK MACHINE AND COMPUTERIZED NUMERICAL CONTROL SYSTEM Ser. No. 191,566 filed on Sept. 29, 1980 now U.S. Pat. No. 4,445,776 issued on May 1, 1984; and all by Gilbert P. Hyatt:

wherein the benefit of the filing dates of said parent, grandparent, and greatgrandparent applications is herein claimed under 35 USC 120 and other authorities provided therefore; and wherein said parent, grandparent, and great-grandparent applications are herein incorporated by reference as if fully set forth at length herein.

The instant application is also related to applications cited as being related to said grandparent application Ser. No. 950,901

INTERACTIVE CONTROL SYSTEM Ser. No. 101,449 filed on Dec. 28, 1970 by Lee, Cole, Hirsch, Hyatt and Wimmer now abandoned in favor of a continuing application;

ADAPTIVE ILLUMINATION SOURCE INTENSITY CONTROL DEVICE Ser. No. 152,105 filed on June 11, 1971 by Lee, Wimmer and Hyatt now U.S. Pat. No. 3,738,242 issued on June 12, 1973;

ADAPTIVE ILLUMINATION CONTROL DEVICE Ser. No. 325,792 filed on Jan. 22, 1973 by Lee, Wimmer, and Hyatt now U.S. Pat. No. 3,927,411 issued on Dec. 16, 1975;

ILLUMINATION CONTROL SYSTEM Ser. No. 327,918 filed Jan. 30, 1973 by Lee, Wimmer and Hyatt now U.S. Pat. No. 3,818,496 issued on June 18, 1974;

INTERACTIVE CONTROL SYSTEM Ser. No. 354,590 filed on Apr. 24, 1973 by Lee, Cole, Hirsch, Hyatt, and Wimmer now U.S. Pat. No. 4,038,640 issued on July 26, 1977;

MEANS AND METHOD FOR SELECTIVELY CONTROLLING ANIMALS Ser. No. 438,328 filed on Jan. 31, 1974 by Lee and Hyatt now U.S. Pat. No. 3,897,753 issued on Aug. 5, 1975; and DIGITAL SIGNAL PROCESSOR FOR SERVO VELOCITY CONTROL Ser. No. 339,817 filed on Mar. 9, 1973 now U.S. Pat. No. 4,034,276 issued on July 5, 1977; wherein these applications are herein incorporated by reference as if fully set forth at length herein.

The systems described in said related applications such as machine control, servo mechanization, position readout, and others can utilize the transducer and system of the present invention for improved capabilities. The transducer of the present invention can use compensation arrangements such as illumination feedback compensation and CCD compensation in accordance with the systems described in said related applications. The combination of the transducer and system disclosed herein with the disclosures in said related applications can be readily practiced by one skilled in the art from the disclosures herein, the disclosures therein, and the wealth of prior art knowledge.

Applicability of related patent applications will now be discussed. Application Ser. No. 879,293 sets forth a photo-optical sensing and processing arrangement in the embodiment of a photo-electric punched tape reader and alternately in the embodiment of an encoder, which disclosures may be used with the encoder of the present invention.

Applications Ser. No. 101,881; Ser. No. 134,958; Ser. No. 135,040, Ser. No. 229,213; Ser. No. 230,872; Ser. No. 232,459; Ser. No. 246,867; Ser. No. 288,247; Ser. No. 291,394, Ser. No. 302,771; Ser. No. 339,817; Ser. No. 339,688; Ser. No.402,520; Ser. No. 476,743; and Ser. No. 752,751 set forth machine control arrangements having transducer feedback, where the encoder of the present invention discloses a transducer feedback arrangement including a multiple speed transducer feedback arrangement discussed with reference to FIG. 3 therein; where the arrangement discussed with reference to FIGS. 2 and 3 herein provides multiple speed (code and vernier) transducer capabilities related thereto.

Applications Ser. No. 152,105; Ser. No. 366,714; and Ser. No. 860,278 teach illumination control including illumination compensation with an illumination feedback servo arrangement and other illumination control and processing teachings which may be used with the optical and illumination arrangement of the sensor of the present invention Applications Ser. No. 522,559; Ser. No. 550,231; Ser. No. 844,765 and Ser. No. 889,301 disclose signal processing and memory arrangements, such as using charge couple devices, that may be used with the encoder of the present invention. For example, photo-sensor arrays discussed herein may be CCD photosensors may use the scale factor and bias compensation disclosed in the embodiments of a CCD register therein.

The above discussions of the pertinence of the related patent applications are exemplary of the many other features disclosed therein that may be used with the sensor of the present invention.

BACKGROUND OF THE INVENTION

1. Field of the Invention

This invention is related to transducers and transducer related systems and in particular to optical encoder motion transducers and systems.

2. Discussion of the Prior Art

Motion transducers are well known in the prior art. These transducers include electromagnetic transducers such as synchros and resolvers, contact transducers such as brush-type encoders, magnetic transducers such as magnetic type encoders, optical transducers such as optical type encoders and optical-type incremental pickoffs, and other such position transducers. Many other motion transducer types are available including tachometers and position switches. Such motion transducers have been incorporated into systems such as digital readout systems, machine control systems, and multitudes of other such systems.

Motion transducers are conventionally used to provide feedback signal for control systems. Many motion transducers are analog transducers such as resolvers, synchros, and tachometers. Digital absolute encoders provide a digital number that defines transducer position and therefore machine position. This digital number, used for control system feedback, can be used for digital control systems operation. Encoders have been implemented as contact, magnetic, or optical encoders. Contact and magnetic encoders have disadvantages such as environmental limitations and wearout. Optical encoders generally provide an improved digital motion transducer. Optical encoders generate a digital output word that is indicative of a shaft position input. They can be used in many applications such as interfacing a computer to a machine, where the encoder can provide a digital number defining the machine's position. Encoders can be used in aircraft, machine tool, position readout, and other systems Conventional encoders may be characterized by a performance/price/size figure-of-merit. For example, an eight-bit resolution encoder may cost $300, a 14-bit resolution encoder may cost $1,200; and a 24-bit resolution encoder may cost $150,000. The $1,200 14-bit resolution encoder may have a six-inch diameter. A smaller 2½ inch diameter 14-bit encoder may be available, but for an increased cost of over $2,000. Therefore, conventional encoders have a performance/price/size figure-of-merit; where cost increases rapidly with increased performance and reduced size.

The optical motion transducer field will now be discussed. Prior art optical transducers include optical encoder transducers and optical incremental transducers. Optical encoders conventionally utilize a code wheel with binary-weighted patterns. These patterns are illuminated and sensed with discrete photo-sensors to provide an encoded output of transducer position. Incremental pickoffs provide for chopping of illumination from an illunnation source and sensing the chopped illumination with a discrete photoelectric sensor. An optisyn incremental pickoff utilizes an optical Moiré fringe effect to provide an optical rotation that is more rapid than the mechanical rotation; where discrete photosensors mounted in physical quadrature positions detect the optical pattern rotation and derive direction from the sequence of quadrature sensors.

Although the motion transducer art is highly developed, it is characterized by transducers that are relatively high in cost, low in accuracy, and large in size. Such transducers have a figure-of-merit that is related to price, accuracy, and size; where greater precision can be achieved at higher cost and larger size, smaller size can be achieved at higher cost and lower precision, and other such combinations of these three parameters can be provided as compromises or tradeoffs to optimize a transducer for a particular application.

The prior art is represented in the art of record herein.

SUMMARY OF THE INVENTION

The present invention is directed to a transducer that provides high precision with low cost and small size and systems architectures for use with such transducers. The high precision, low cost, and small size characteristics are achieved through various inventive features including the combination of a code wheel and a vernier, the use of a monolithic photosensor array, electronic signal processing for deriving high precision output information without ambiguity, use of a microcomputer for performing computation and control operations, and other features. Such features can be provided individually or in combination to achieve the advantages discussed herein.

The encoder of the present invention, in a preferred embodiment, is an absolute optical encoder, providing a performance/price/size figure-of-merit better than conventional encoders. It can be implemented with a new and unique optoelectronic principle that provides very high resolution with a small size and low cost device. It may be feasible to provide a 14-bit resolution 1½-inch diameter optical encoder to sell profitably for under $100; compared to conventional 14-bit optical encoders costing ten-times to twenty-times as much in a significantly larger package.

A unique encoder configuration solves prior art problems such as mechanical and optical alignment and size. A miniature high resolution configuration can be implemented that is low in cost and easy to manufacture. This is based upon an automatic and simple ultra-high precision alignment and calibration approach. Therefore, prior art problems with size, alignment, drift, manufacturability, etc are solved without the brute force prior art approaches that significantly degrade cost, size, and precision.

One embodiment of the encoder of the present invention is based upon a versatile technology that is applicable to a wide range of encoders from a miniature, low cost, medium precision configuration to an ultra-high precision configuration and covering all capabilities inbetween. For example, a fourteen-bit, 1½ inch diameter encoder may cost under $100 compared to conventional fourteen-bit encoders having a 2½ inch diameter and costing over $2,000. Also, a twenty four-bit six-inch diameter encoder may cost under $5,000 compared to conventional twenty four-bit encoders having a sixteen-inch diameter and costing over $200,000.

In a preferred embodiment, an optical transducer uses an optical disk having an encoder code wheel in combination with an optical vernier. The optical code wheel provides the most significant bits (MSBs) of a position number and the optical vernier provides the least significant bits (LSBs) of a position number. Circuitry for signal processing and a microcomputer for data processing provides high precision motion information. Novel use of a photosensor array provides many optical sensors in a relatively low cost and high density configuration. An improved mechanical and optical structure facilitates low cost, high precision, and small size.

An ultra-high precision configuration utilizes a two dimensional photosensor array in combination with signal processing and/or data processing capability to derive ultra-high precision position information from raw signals generated by the two dimensional photosensor array. A lower cost, lower precision, and smaller size configuration utilizes a single dimensional photosensor array in place of the two dimensional array discussed above. Serial accessing and processing of array signals reduces interconnections and electronics to enhance the low cost and small size characteristics. Adaptive compensation of array signals improves precision and reduces array costs. Array characteristics such as small size and high density facilitate high precision and small size transducer characteristics. Optical and mechanical alignment, typically a problem in high precision prior art transducers, is significantly simplified with a unique transducer architecture and physical configuration; thereby enhancing precision, cost, and size characteristics.

An object of this invention is to provide an improved transducer.

A further object of this invention is to provide an improved transducer system.

A further object of this invention is to provide an improved optical transducer.

A further object of this invention is to provide a transducer having relatively high accuracy, low cost, and small size.

A further object of this invention is to reduce interconnecting cabling.

A further object of this invention is to provide an improved position transducer.

A further object of this invention is to provide an improved velocity transducer.

A further object of this invention is to provide an improved acceleration transducer.

A further object of this invention is to provide an improved non-motion transducer.

A further object of this invention is to provide a transducer having a code wheel in combination with a vernier.

A further object of this invention is to provide an integral code wheel and vernier.

A further object of this invention is to provide an improved ambiguity resolution capability.

A further object of this invention is to provide a transducer with enhanced optical and mechanical alignment capability.

A further object of this invention is to provide a transducer utilizing a two dimensional photosensor array.

A further object of this invention is to provide a transducer utilizing a single dimensional photosensor array.

A further object of this invention is to provide a transducer providing ultra-high precision.

A further object of this invention is to provide an intelligent transducer.

A further object of this invention is to provide a transducer utilizing computer data processing capabilities.

A further object of this invention is to provide an improved digital readout system.

A further object of this invention is to provide an improved machine control system.

A further object of this invention is to provide an improved servo control system.

A further object of this invention is to provide an improved data logging system.

A further object of this invention is to provide compensation to reduce errors.

A further object of this invention is to provide an illumination feedback arrangement.

A further object of this invention is to provide a reference signal compensation arrangement.

A further object of this invention is to provide a temperature compensation arrangement.

A further object of this invention is to provide an improved alignment system.

The foregoing and other objects, features, and advantages of this invention will be described in the following detailed description of preferred embodiments of this invention, as illustrated in the accompanying drawings.

BRIEF DESCRIPTION OF THE DRAWINGS

A better understanding of this invention will be had from consideration of the detailed description taken in conjunction with the drawings briefly described below.

FIG. 2 comprises FIGS. 2A to 2E, wherein

FIG. 4 comprising FIGS. 4A-4H illustrates transducer signal processing in accordance with one embodiment of the present invention wherein FIG. 4A is a block diagram of a converter and processor output arrangement; FIG. 4B is a block diagram and schematic representation of transducer signal processing electronics; FIGS. 4C-4F are simplified waveform representations; FIG. 4G is a schematic and block diagram representation of an illumination control arrangement; and FIG. 4H is a schematic and block diagram representation of a temperature control arrangement.

Figure 1:
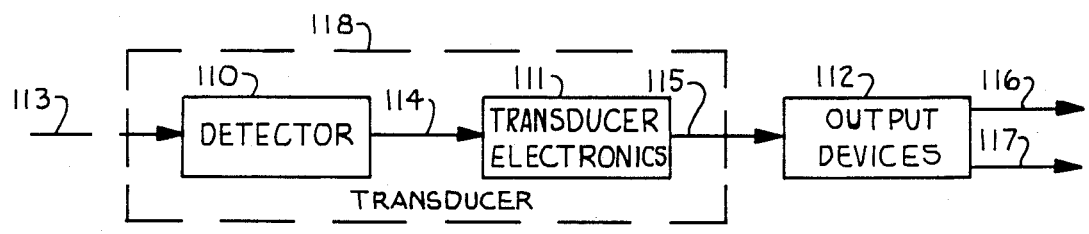
FIG. 1 is a block diagram representation of the transducer of the present invention.

By way of introduction of the illustrated embodiments, the components shown in the figures have been assigned general reference numerals and a description of each such component is given in the following detailed description. The components in the figures have been assigned three-digit reference numerals wherein the hundreds digit of the reference numeral is related to the figure number except that the same component appearing in successive figures has maintained the first reference numeral. For example, the components in FIG. 1 have one-hundred series reference numerals (100 to 199) and the components in FIG. 2 have two hundred series reference numerals (200 to 299).

DETAILED DESCRIPTION OF THE INVENTION

Gernral Description

The system of the present invention can take any of a number of possible forms. Preferred embodiments of the present invention will be discussed relative to the figures herein. Still other embodiments can be practiced by those skilled in the art from the teachings herein.

A general block diagram of an illustrative embodiment of the system 100 of the present invention is shown in FIG. 1A. Transducer 118 generates output signal 115 to output devices 112 in response to input signal 113. Detector 110 receives mechanical input 113 and generates detector signal 114 in response thereto. Transducer electronics 111 processes detector signal 114 to generate transducer output signal 115. Output devices 112 perform output operations in response to transducer output signal 115, such as generating electrical signals 116 and generating non-electrical signals 117.

Transducer 118 can be any well known transducer for use with output devices 112 but, in a preferred embodiment, is the transducer of the present invention. Input signal 113 can be a mechanical input such as by gearing the shaft of transducer 118 to a member of a machine or other well known mechanical input. Detector signal 114 can be a raw unprocessed signal such as a photosensor signal from detector 110. Unprocessed detector signal 114 can be amplified in detector 110 with an electronic amplifier to faciliate communication to electronics 111, which can be located remote relative to detector 110. Alternately, electronics 111 can be partially or fully located in the same structure as detector 110 for an integral detector and electronic arrangement, as indicated by grouping together in transducer block 118.

Electronics 111 can include signal processing electronics and data processing electronics. Signal processing electronics can include amplifiers, analog circuitry, digital logic, analog to digital (A/D) converters, digital to analog (D/A) converters, and other such signals processing electronics Data processing electronics can include a computer such as the microcomputer of the referenced applications or a well known microcomputer such manufactured by Intel Corp of Santa Clara, CA Models No. 8080, No. 8048, No. 8085, No. 8021, and others. Many other microcomputers are well known in the art. Data processing may involve operations under program control to process the preprocessed signals such as for greater precision, code conversion, formatting, etc. Transducer signal 115 can be any convenient signal form including analog and digital signal forms but, in a preferred embodiment, represent digital numbers indicative of motion of transducer 118.

Output devices 112 can be any output devices disclosed herein, disclosed in referenced applications or well known in the art. Output devices 112 include display devices which generate display illumination 117, electrical devices which generate electrical signals 116, or other output devices. Electrical output devices can include motor controllers and servo drives for controlling machines, printer signals for logging transducer information, or other electrical signals.

Although the present invention may be discussed relative to specific embodiments such as a motion transducer, many other embodiments thereof can be provided; wherein the teachings of the present invnetion are not limited to monitoring motion, providing the function of a transducer, etc. For example, parameters such as pressure, electrical current, and others can be monitored in place of motion. Also, functions such as alignment can be provided in place of transducer functions. Some of these alternate embodiments are discussed herein and in the referenced parent applications as exemplary of the broadly applicable teachings of the present invention.

Optical Arrangement

Figure 2A:
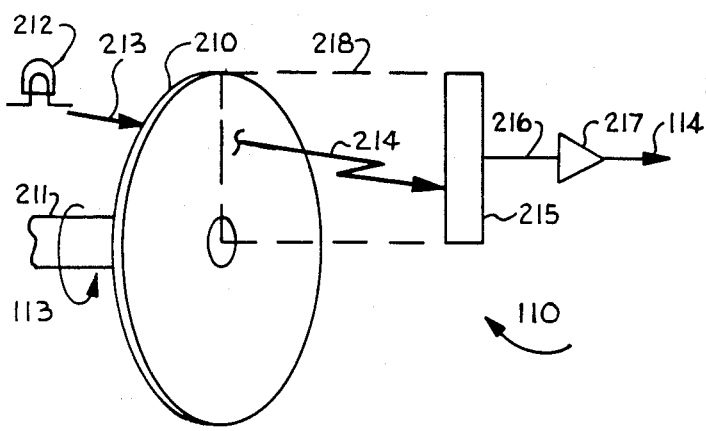
FIG. 2A is a pictorial illustration of an optical transducer in accordance with the present invention.

An optical arrangement of a preferred embodiment of transducer 118 will now be discussed relative to FIG. 2. A pictorial representation of such an optical arrangement is shown in FIG. 2A. Optical wheel 210 is illuminated with illumination source 212 generating source illumination 213. Photosensors 215 monitor output illumination 214 transmitted by optical wheel 210. Alternately, output illumination 214 can be reflected illumination, refracted illumination, filtered illumination, polarized illumination, or other forms of output illumination in place of transmitted illumination 214; where optical wheel 210 can be a reflection device, a refraction device, a filtering device, a polarizing device, or other device to provide reflected, refracted, filtered, polarized or other illumination; respectively. Similarly, wheel 210 can be configured in any convenient form and can be a two dimensional device in shapes other than a wheel, can be a three dimensional device such as a prism, or can be other shapes and forms.

A transducer embodiment 110 is shown in FIG. 2A. Optical device 210 is mounted on shaft 211, where optical device 210 rotates with shaft 211. Illumination source 212 and and illumination sensors 215 are mounted to sense their relative rotation of optical device 210. As shaft 211 rotates, optical wheel 210 is rotated relative to source 212 and sensors 215. As wheel 210 is rotated, illumination 213 from source 212 illuminates patterns on rotating wheel 210 to generate output illumination 214 having an illumination pattern related to the position of wheel 210. Sensors 215 sense the pattern of output illumination 214 as being indicative of the angular position of wheel 210. Sensors 215 generate sensor signal 216 which may be amplified with electronic amplifier 217 to generate transducer signal 114 for processing with transducer electronics 111.

In one embodiment, optical wheel 210 can be a photographic medium having the optical pattern (FIG. 3) exposed on an 0.008 inch thick photographic film. This optical pattern on film can be cut out in a circular form and bonded to the end of shaft 211 (FIG. 2A); thereby facilitating a low cost, high precision, and easy to manufacture arrangement. Alternately, optical wheel 210 can be constructed with various photolithographic processes such as by exposing and etching metalized material to obtain transparent and opaque segments or by using various well known alternate processes and devices. In other alternate embodiments optical wheel 210 can be inserted over shaft 211 in various well known manners to facilitate mounting and support.

Greater precision can be achieved by controlling dispersion of illumination. For example, illumination 214 will disperse from the fine pattern established by optical wheel 210 as illumination 214 propogates to expose array 215. Dispersion can be reduced or illumination can be colliminated with arrangement 218; which can include a material having holes provided therein for guiding illumination 214, fiber optic filaments for guiding illumination 214, or various well known arrangements guiding illumination 214 to reduce dispersion effects. In an illustrated embodiment, a plate having fine holes therein is provided to guide the illumination from optical wheel 210 to array 215. This plate can be constructed as a plate split through the center line of the desired holes. The holes can be constructed as grooves in the split plate. When the grooves are matched up between the two plates, fine holes for illumination conduction are achieved. Alternately; holes can be drilled, punched or otherwise generated and other optical arrangements can be provided for illumination collimination.

Figure 2B:
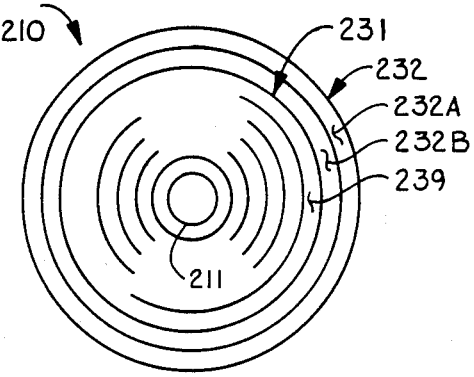
FIG. 2B is a diagram of an optical wheel in accordance with the transducer of FIG. 2A.

One embodiment of optical wheel 210 is shown in FIG. 2B. Wheel 210 is mounted on shaft 211. It includes an encoder portion 231 and a vernier portion 232. Source 212 can provide illumination 213 for illumination of both the code portion 231 and the vernier protion 232 of wheel 210. Illumination sensors 215 are arranged for sensing encoded pattern 231 and vernier pattern 232 as output illumination 214. Coded portion 231 may be coded in well known encoder formats such as with binary codes, grey codes, V-scan codes, U-scan codes, and various well known codes. Methods for processing such codes are well known in the art to resolve ambiguity of encoder position.

Coded portion 231 of wheel 210 can include conventional arrangements of a plurality of concentric tracks having combinations of transparent and opaque segments arranged in a particular coded form. Each track, progressing from the outermost track to the innermost track represents weighted binary numbers (i.e.; from the least significant bit (LSB) through the most significant bit (MSB), respectively). The outermost code track 239 can be implemented as the LSB track in order to maximize resolution, wherein the LSB code pattern has the smallest dimension pattern and wherein the outermost track has the greatest circumference or dimension.

A photosensor can be used to sense encoded position of the transducer. For example, detector 110 can have a disk 210 with an eight-bit code portion 231. This eight bit code portion can utilize eight concentric tracks, having binary weighted or otherwise weighted codes provided thereon. Resolution of eight binary bits yields an angular position resolution of one part in 256 or approximately ¼% resolution, equating to approximately 1.4 degree resolution (360 degrees/256 conditions).

The LSBs of the transducer position can be derived from vernier pattern 232. In one embodiment, vernier pattern 232 can be one or more optical tracks on optical wheel 210 having a plurality of diagonal slits extending around each vernier track. An illuminated slit exposes a portion of an array of photosensors 215, wherein the portion of the array exposed is indicative of the vernier position of optical wheel 210 and optical slits 232. Optical slits 232 can be registered with code wheel 231 to provide a least significant position number with optical slits 232 and a most significant position number with optical code tracks 231.

Figure 2C:
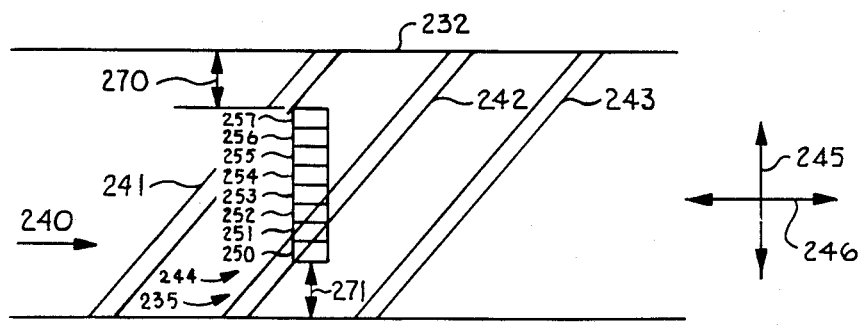
FIG. 2C is a diagram of a single dimensional photosensor array vernier arrangement.
Figure 2D:
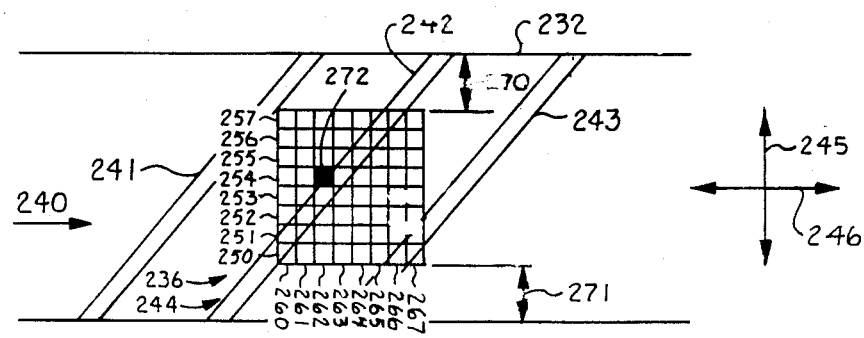
FIG. 2D is a diagram of a two dimensional photosensor array vernier arrangement.
Figure 3A:
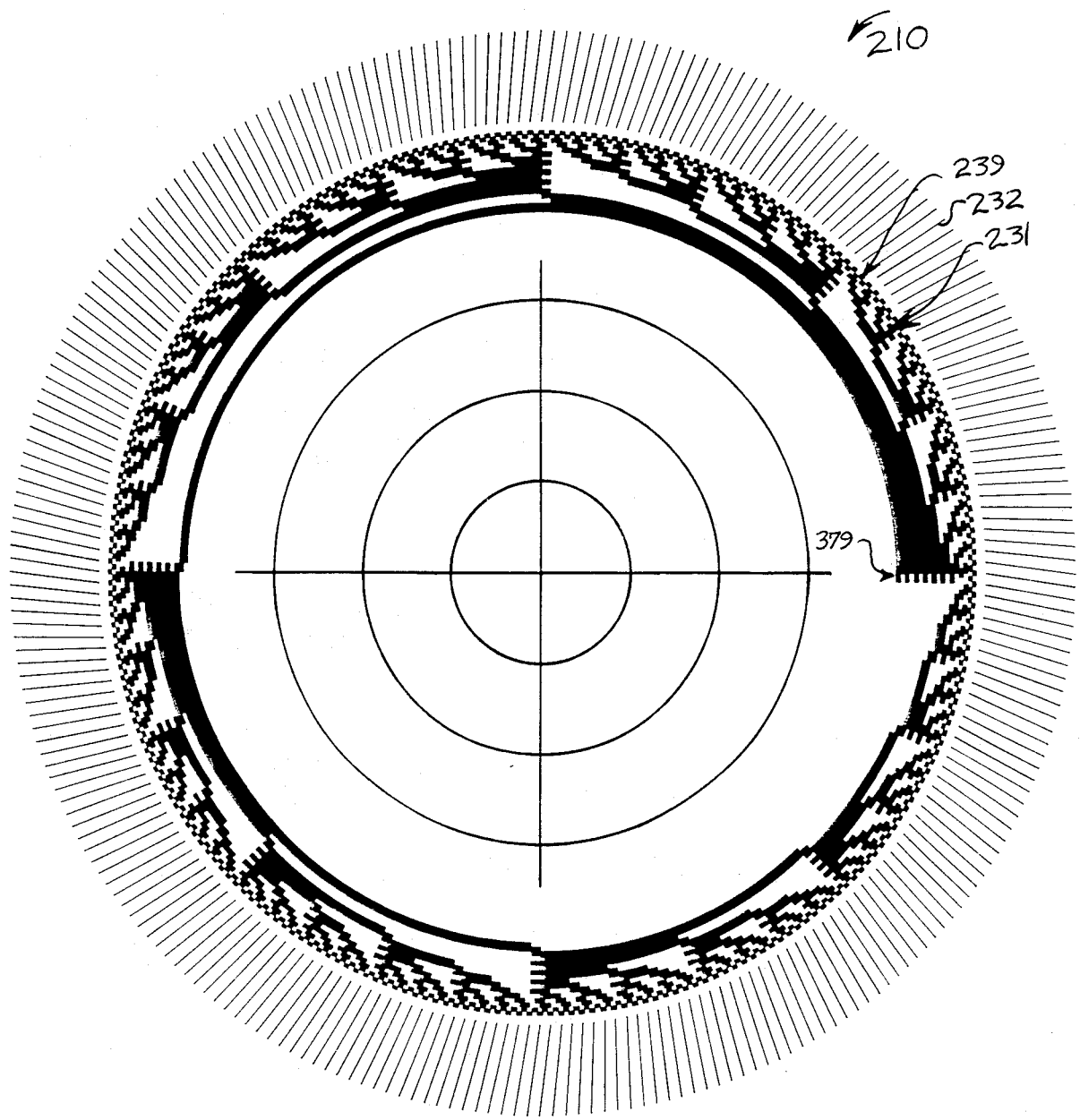
FIG. 3 is a copy of an artwork used to implement one embodiment of an optical wheel, comprising FIG. 3A showing the complete artwork and FIGS. 3B and 3C showing the right and left sides of the artwork in enlarged form.
Figure 3B:
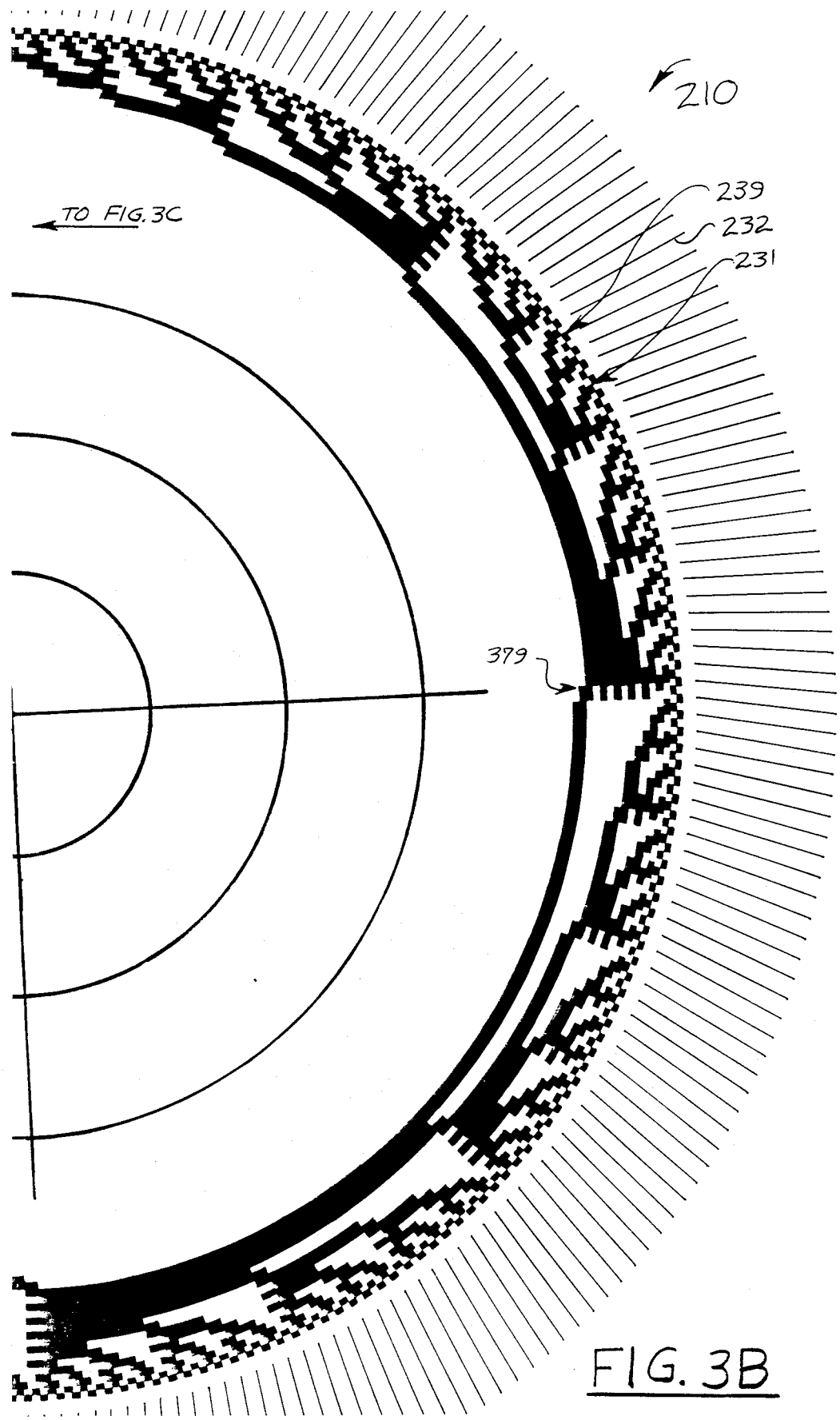
Figure 3C:
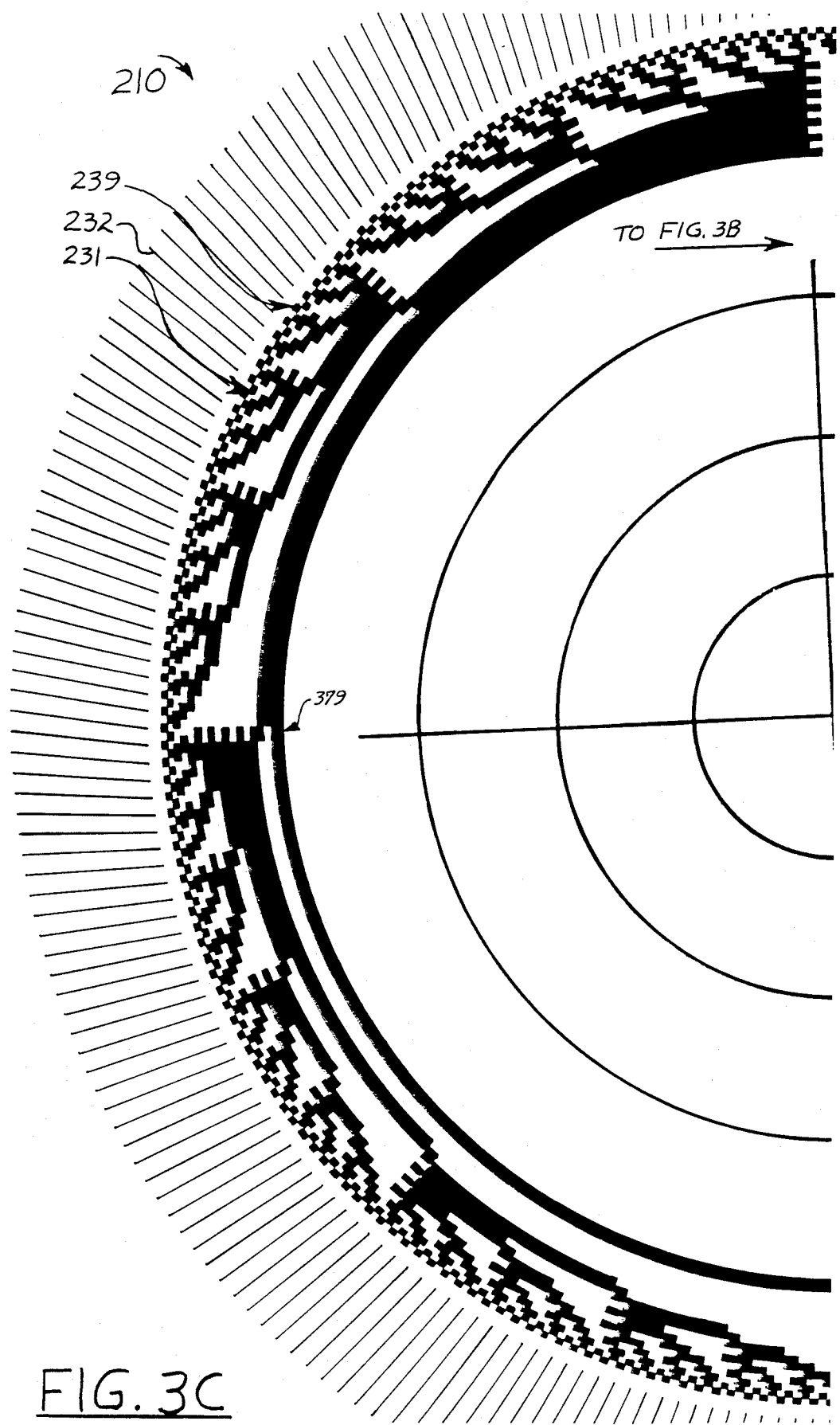

A photocopy of an actual artwork for optical wheel 210 is shown in FIG. 3. FIG. 3A shows the complete artwork and FIGS. 3B and 3C show enlarged views of the two halves of the artwork in enlarged form. The left side of FIG. 3B connects to the right side of FIG. 3C, as indicated by the matching arrows directing one to make such a connection. The artwork in FIG. 3A is shown rotated 180° in FIGS. 3B and 3C. Code tracks 231, including the LSB track 239 at the outer periphery and getting progressively more significant toward the inner periphery of code tracks 231, and vernier track 232 are shown; consistent with the arrangements discussed with reference to FIGS. 2B-2D herein. This optical pattern is a photocopy of an actual optical wheel. It has been photographically generated and can be provided to be substantially any size, depending upon desired transducer dimensions, precision, etc. For one embodiment of the transducer actually constructed, the pattern shown in FIG. 3 is oversized and was reduced to a diameter of about two inches.

The code wheel tracks 231 can be seen having binary dimensions reducing from the largest binary dimension on the innermost track to the smallest binary dimension on the outermost track. The innermost track represents the MSB, where the transparent and opaque segments cover 180 degree arcs. The second MSB track covers four 90 degree arcs of alternating opaque and transparent segments. Similarly, each less significant track progressing towards the outer periphery of code tracks 231 can be seen to have segment lengths that are one half of the segment length of the adjacent more significant segment. The LSB or outermost code track 239 can be seen to be alternating transparent and opaque segments related to the LSB resolution of the code wheel. It can be seen that there are eight separate code tracks for eight bit resolution or one part in 256. Therefore, there are 256 alternate transparent and opaque segments in MSB track 239. It can also be seen that each LSB segment on track 239 is matched up with a corresponding slit of vernier track 232. Therefore, vernier track 232 resolves the transducer position to a small fraction of the resolution of MSB track 239.

Vernier track 232 is shown having significantly greater width than code tracks 231. Each code track requires only a single photosensor to determine the transparency or nontransparency of the pattern, wherein the width of a code track is primarily related to photosensor dimensions and alignment, not precision. Conversely, vernier track 232 is used to interpolate in a continuous form, where vernier resolution is related to the length of the vernier slit and the related length of the transducer array sensing the vernier illumination. Therefore, the vernier track has been made as wide as practical consistent with array dimensions and is therefore shown as being significantly wider than a code track.

This optical pattern shown in FIG. 3 is shown as a negative, wherein the actual optical wheel 210 that has been constructed has transparent portions indicated by the black portions of FIG. 3 and has opaque portions indicated by the white portions of FIG. 3. Greater precision is achieved with transparent slits 232. Alternately, slits 232 may be opaque, as shown in the negative pattern of FIG. 3.

An optical arrangement to aid in resolution of amibiguities will now be discussed with reference to FIG. 3. Optical code patterns 231 of optical wheel 210 are shown having offset or overlapping edges such as shown with edges 379 having adjacent track edges staggered. It can be seen that transitions between optical patterns can be identified without ambiguity based upon these staggered transitions.

Alternate embodiments of a single track vernier implementation will now be discussed relative to FIG. 2C for a one dimensional array 235 and relative to FIG. 2D for a two dimensional array 236. Vernier track 232 has a plurality of diagonal slits 240, such as slits 241-243, continuing for the length of the track around optical wheel 210. Slits 240 can be oriented at an angle to photosensor array 244, wherein FIG. 2C illustrates a line array or single dimensional array embodiment and FIG. 2D illustrates a two dimensional array embodiment. For simplicity of illustration, array 244 comprising single dimensional array 235 (FIG. 2C) or two dimensional array 236 (FIG. 2D) is illustrated as a rectangular array that is square with radial direction 245 and tangential direction 246 of wheel 210 and slits 240 are illustrated at an angle to radial direction 245 and tangential direction 246 of wheel 210. In one illustrative embodiment, slits 240 may be at an angle of eight degrees (8°) from the radial direction 245 and array 244 may be square with or at an angle of zero degrees (0°) from the radial direction (FIGS. 2C and 2D). In other embodiments, slits 240 and array 244 may be at different angles from each other and from the radial direction 245. In other embodiments, slits 240 can be arranged to be square with radial direction 245 and array 244 can be arranged to be at an angle to radial direction 245, or both slits 240 and array 244 can be at angles to radial direction 245 and at angles to each other. In a preferred embodiment, slits 240 are provided at an angle to array 244, independent of whether slits 240 or array 244 are square with radial direction 245 and tangential direction 246 of wheel 210.

Slits 240 may have a component along array 244 that is longer than array 244 for extending therebeyond 270 and 271 (FIGS. 2C and 2D) or equal to the length of array 244 (not shown), or shorter than the length of array 244 (not shown). For convenience of illustration, the former condition (FIGS. 2C and 2D) discussed herein.

As wheel 210 rotates past array 244, slits 240 traverse array 244 in the radial direction 245. For example, if slits 240 move to the left (FIGS. 2C and 2D), slits 240 will initially illuminate the bottom photosensor and progress vertically upward for exposing the higher level photosensors. Slit 242 will initially expose sensor 250, then sensor 251, then sensor 252, etc progressing vertically upward until the topmost photosensor 257 is exposed. Prior slit 242 will then pass upward beyond exposing of array 244 and the next slit 243 will immediately commence exposing array 244 beginning with the bottonmost sensor 250 and progressing vertically upward past photosensor 252 and past array 244, as discussed for slit 242.

The dimensions of slits 240 and array 244 can be adjusted for various degrees of exposure. For example, slits 240 can be narrower than photosensor elements of array 244 (i.e.; an 0.0005 inch slit for an 0.001 inch element) such as for simultaneous exposure of a small number of vertical elements; or slits 240 can be about as wide as elements of array 244 (i.e.; an 0.001 inch slit for an 0.001 inch element) such as for simultaneous exposure of a medium number of vertical elements; or slits 240 can be wider than elements of array 244 (i.e.; an 0.003 inch slit for an 0.0005 inch element) such as for simultaneous exposure of a larger number of vertical elements. The arrangements shown in FIGS. 2C and 2D are shown with slits 240 that are about as wide as array elements 250–257, simultaneous exposing a plurality of vertical array elements. For example, slit 242 is shown in FIG. 2C partially exposing element 250, substantially entirely exposing elements 251, partially exposing elements 252 and 253, and not exposing elements 254–257.

An arrangement is described above using a sensor array having sensor dimensions of about 1 mil. Various technologies now in use and in development facilitate smaller dimensional arrays such as 0.1 mil and smaller dimensions per sensor element. Use of such smaller dimensional arrays yields greater precision. For example, a vernier array having ten times smaller elements permits ten times greater resolution, such as by translating across ten times as many array elements for a sensed motion. Therefore, as array dimensions are decreased, transducer resolution is correspondingly increased.

The dimensions, angles, and relationships between slits 240 and array 244 will now be discussed. In an illustrative embodiment the rotational distance of wheel 210 to cause one slit, such as slit 242, to make a full traverse of array 244 from element 250 to element 257 may be equal to the rotational distance to traverse one LSB distance on the LSB track 239 on the outer periphery of wheel 210. Therefore, each LSB increment of motion of wheel 210 can be divided into a plurality of finer positions with the vernier implementation of track 232 and array 244. Similarly, each increment of motion of wheel 210 can be divided into a plurality of finer positions with other vernier tracks, as will be discussed hereinafter.

In view of the above, it can be seen that slits 240 traverse array 244 vertically upward as optical wheel 210 is rotated to the left for each least significant code bit of track 231 of wheel 210. Monitoring of the vernier photosensor signals 216 from array 244 precisely defines the interpolated position between LSB positions of code tracks 232. In one embodiment, the output signals of the photosensors of array 244 are utilized in analog signal form to establish the slit position. In another embodiment, the output signals of the photosensors of array 244 are compared with a threshold for "squaring up" the output signals to generate digital output signals to establish the slit position. Such processing is provided with transducer electronics 111 (FIG. 1) and is discussed in detail with reference to FIG. 4 herein.

A shorthand notation will now be described for use in identifying array elements. Array 244 (FIGS. 2C and 2D) contains a plurality of photosensor elements. For simplicity of discussion, elements are shown arranged in the rectangular configurations of a single dimensional line array 235 (FIG. 2C) and a two dimensional array 236 (FIG. 2D). Elements spaced vertically in the plane of FIG. 2C and FIG. 2D along radial direction 245 are defined as column arrays having sensors 250 through 257 progressing upward or radially outward. Two dimensional array 236 (FIG. 2D) may be characterized as having a plurality of column arrays 260–267. Elements in a column array 235 (FIG. 2C) are identified with reference numerals 250–257, progressing readily outward towards the top of the figure. Elements of a two dimensional array 236 (FIG. 2D) are identified by the intersection of radial column array and a tangential row array. For example, element 272 in two dimensional array 236 (FIG. 2D) may be identified by the column array 262 and the row array 254 intersecting thereon. For example, photosensor 272 at the intersection of column array 262 and row array 254 will herein be identified as sensor 262/254 identifying the column array first and the row array second and separated by a slash (/) mark.

From the discussions herein, it will be apparent that the combination of sensors of array 244 that are exposed through slits 240 will establish the angular vernier position of optical wheel 210. If array 244 is a line array as shown in FIG. 2C, the angular vernier position of optical wheel 210 can be precisely defined within the resolution of slits 240 and array 244. Greater vernier position resolution can be obtained with a two dimensional array such as array 236 shown in FIG. 2D, wherein slits 240 expose a plurality of vertical line arrays 260–267 of two dimensional array 244. These line arrays provide a plurality of sets of position information, analageous to the single set of position information discussed for the one dimensional line array 235 herein. Therefore, non-redundant information obtained with the plurality of line arrays 260–267 in two dimensional array 236 (FIG. 2D) permits more precise interpolation of the position of slits 240.

A maximum amount of non-redundant information can be obtained by properly orienting slits 240 and array 236 and by establishing dimensions and other parameters for slits 240 and array 236. For example, if slit 242 were along a diagnonal of array 236 such as the diagonal from element 260/250 to element 267/257; then redundant information would be maximized and the ability to interpolate to a resolution beyond that available with a single line array 235 would be reduced. Alternately, if slit 242 were not along a diagonal of array 236 but skewed therefrom, such as being along the skewed line shown with slit 242 from element 260/250 at the lower left-hand corner of array 236 and being skewed from the diagonal of array 236 to traverse one element to the left of diagonal element 267/257, which is element 267/257; then a greater amount of non-redundAnt information would be provided. This is because the overlapping of slit 242 with the sensors for each vertical line array 260–267 is different, thereby providing different and non-redundant information from each vertical line array 260–267. Processing of the signals from two dimensional array 236 is discussed hereinafter and may include "least squares fit" processing or other processing of a line mapped across the two dimensional X-Y pattern of array 236. Alternately, columns 260–267 of two dimensional array 236 can be scanned to determine the column having the fewest photosensors exposed to the slit, where identification of such a column is indicative of the interpolated position of the vernier.

One relationship between the plurality of slits can be seen relative to FIG. 2C. Slits 240 may be arranged so that, when a prior slit is just exiting from exposing array 244, the next slit has already entered for exposing array 244. Therefore, as slit 241 is exiting from top photosensor 257 slit 242 is exposing intermediate photosensors such as photosensor 253. Similarly, relative to FIG. 2D, as slit 241 is exiting from top photosensor 260/257, slit 242 is entering to bottom photosensor 260/250 at the near end of array 236. Similarly, as slit 242 is just exiting column array 267 by exposing photosensor 266/257, slit 243 is just entering bottom photosensor 266/250.

Another relationship between the plurality of slits will now be described relative to FIG. 2C. Slits 240 may be arranged so that, when a prior slit is just exiting from exposing array 244, the next slit is just entering for exposing array 244. Therefore, as slit 241 is exiting from top photosensor 257, slit 242 is entering to bottom photosensor 250. Similarly, relative to FIG. 2D, as slit 241 is exiting from top photosensor 260/257, slit 242 is entering to bottom photosensor 267/250 at the far end of array 236; or to bottom photosensor 265/250 at the middle of array 236; or to intermediate photosensor 265/252 at the middle of array 236.

A lens arrangement such as having axial symmetry can be used to process illumination 213 for projecting on to array 215 to achieve capabilities such as illumination collimation, concentration, distribution, etc. This lens facilitates use of a single illumination source 212, where illumination 213 from source 212 can be distributed over array 215. This lens can also be used for illumination distribution and concentration to concentrate the image from a single source 212 on array 215 to provide necessary illumination intensity. Use of an array facilitates simple optics and illumination control, where array 215 provides high density of photo-sensors and therefore a relatively small size photo-sensor device. This facilitates relatively small lenses for enhanced optical and mechanical considerations and for reduced illumination energy requirements. For example, a small lens can be manufactured less expensively, can be mounted more efficiently, and can provide other advantages. Also, high density photo-sensors permits efficient concentration of illumination thereon.

In an alternate arrangement having discrete photosensors, the optical arrangement would have to cover larger dimensions. Also, illumination energy would be utilized less efficiently due to the focusing of illumination energy on the intervening spaces between photosensors in addition to focusing of illumination energy on the photosensors. Alternately, methods to concentrate energy on spaced-apart photosensors and to reduce the focused illumination energy between photosensors may require complex illumination control devices such as fiber optics, multiple sources and lenses, etc.

In view of the above, the use of the batch fabricated lens arrangement in combination with a high density photosensor array facilitates low cost lenses and efficient illumination source arrangements.

Another feature of the present invention derived from the use of a photosensor array is the ability to utilize photosensors for auxiliary functions such as alignment, orientation, and others. In the prior art, encoders were implemented having precisely one photosensor per track. In such systems, it was necessary to precisely align each photosensor with a corresponding optical track. Spaces between tracks and spacings between photosensors were necessarily large to facilitate mounting, alignment, and other physical operations. Use of a photosensor array in accordance with the present invention provides a batch fabricated arrangement; where multitudes of photosensors (more than one photosensor per track) may be provided in a precisely aligned photo-optical array having miniature dimensions. This arrangement reduces individual photosensor alignment requirements, track dimensional requirements, and other requirements. This multiple photosensor per track arrangement enhances alignment, efficiency, resolution, and other characteristics.

In view of the above, the use of miniature, batch fabricated arrays of photosensors having more photosensors than tracks provides important advantages over prior art encoder type transducers.

Ambiguity of transitions between codes of the encoder has led to the use of methods such as grey codes, V-scan codes, U-scan codes, etc. In accordance with another feature of the present invention, alternate arrangement thereto are provided. In one embodiment shown in FIG. 3, code patterns are offset or staggered from each other and do not line up to facilitate ambiguity resolution. In another embodiment where the beginning of a slit 240 is lined up with the beginning of a transition between whole number codes, sampling of the whole number code can be performed when the vernier output is of the center of the scale, such as when slit 242 is illuminating sensors 253 and 254 (FIG. 2C), which condition can be used for clocking or sampling the digital number from code wheel 210 into a sample register when the code wheel is at the center of a bit position. Use of the vernier in this manner resolves ambiguity of reading the encoder output signals and circumvents the need for grey codes, V-scan codes, and other ambiguity resolution methods.

Figure 2E:
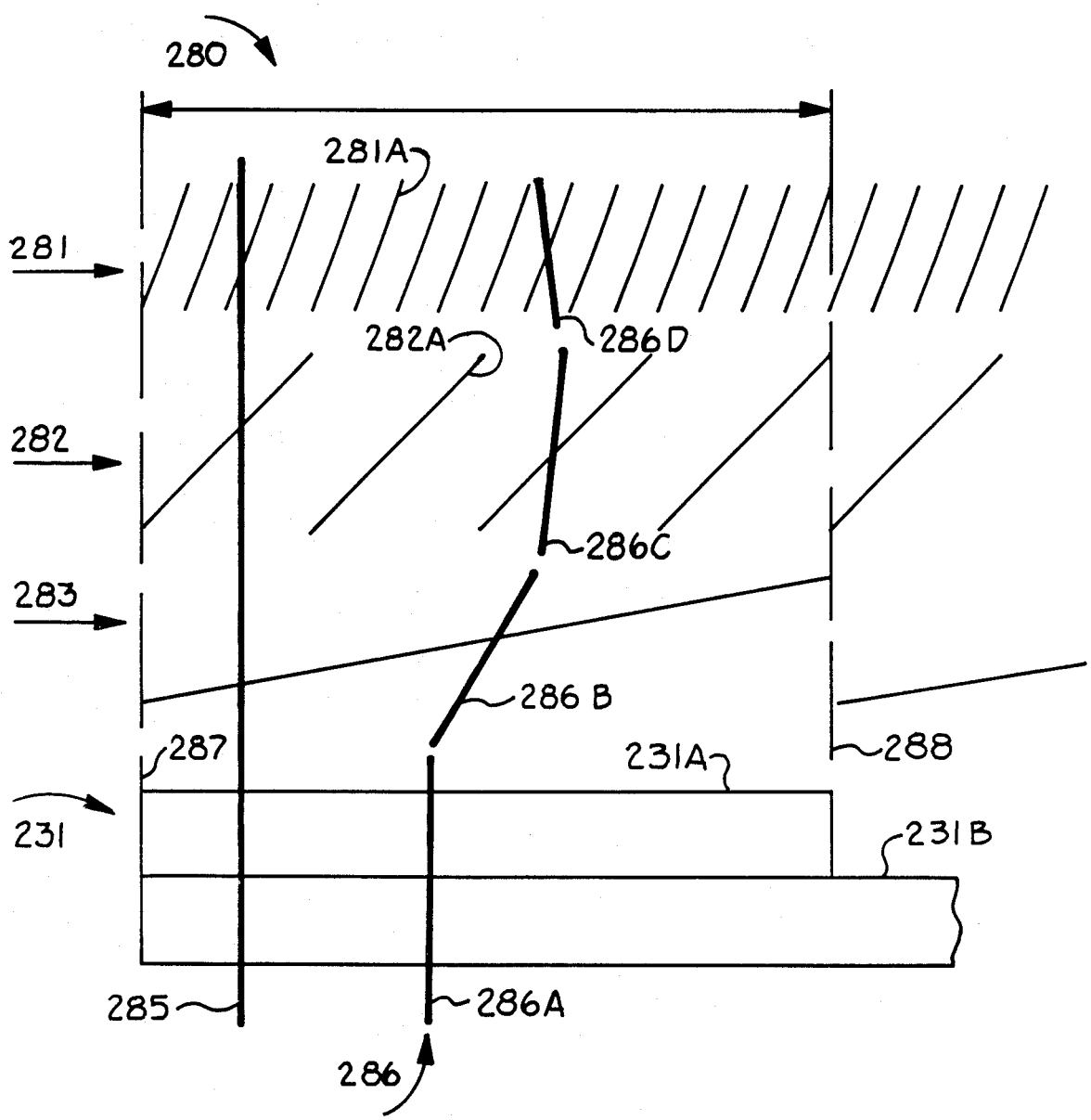
FIG. 2E is a diagram of an optical wheel in accordance with the transducer of FIG. 2A showing a multiple vernier arrangement.

Single tracks of optical slits are discussed herein with reference to FIGS. 2B and 2E; which are exemplary of a plurality of vernier tracks, such as for greater resolution, greater precision, reduced size, and other considerations; where different quantities of vernier tracks can be provided to facilitate particular requirements such as 1, 2, 3, 8, 15, or any other quantity of vernier tracks.

The vernier implementation discussed herein can be used without encoder tracks 231 to provide a very high resolution incremental pickoff, as discussed below. One arrangement discussed herein provides a least significant byte from vernier tracks 232 for use in conjunction with the most significant byte from whole number encoder tracks 231 for a dual range whole number pickoff. Alternately, vernier tracks 232 (FIG. 2B) can be used alone to interpolate the position between slit increments, where transducer 118 can generate an output pulse 115 (FIG. 1) each time a new slit is detected by array 244 (FIG. 2) and can similarly generate an output pulse 115 for each incremental distance detected as slits 240 progress along array 244, indicative of shaft rotation. This embodiment provides a high resolution incremental transducer having a small size and being low in cost. The vernier implementation discussed herein can be used with encoder tracks to provide a high resolution transducer, as discussed below. Alternately, the encoder implementation discussed herein can be used without vernier tracks 232 to provide a whole number optical encoder, as discussed below. One arrangement discussed herein provides a most significant byte from code tracks 231 for use in conjunction with the least significant byte from vernier tracks 232 for a dual range whole number pickoff. Alternately, code tracks 231 (FIG. 2B) can be used alone to generate a code related to encoder position. Many other combinations of encoder tracks and/or single vernier tracks and/or a plurality of vernier tracks can be provided based upon the illustrative teachings herein.

Another embodiment provides a plurality of least significant bytes from a plurality of vernier tracks 232 for use in conjunction with the most significant byte from whole number encoder tracks 231 for a triple range whole number transducer. Alternately, vernier tracks 232 can be used to interpolate this position between slit increments, where transducer 118 can generate an output number 115 (FIG. 1) based on a most significant byte derived from coarse vernier track 232B and a least significant byte received from fine vernier track 232A in a manner similar to that discussed above for a code wheel and vernier embodiment. Such an embodiment provides a high resolution whole number transducer having a very small size and being very low in cost, using only vernier tracks.

Multiple vernier track arrangements are further discussed in the section entitled Multiple Vernier Arrangements herein.

An error correction arrangement can be implemented, which will now be discussed for the slit-related incremental transducer. In this embodiment, the incremental pulse associated with the vernier for a particular slit will have incremented through a predetermined count when the next slit is detected, permitting detection and correction of erroneous counts associated with the vernier sensors. Such an error detection and correction arrangement is particularly pertinent to the incremental transducer, where a whole number encoder can determine absolute position independent of prior readings and therefore can automatically compensate for accumulating errors.

One embodiment of the transducer may utilize a single photosensor array for eight code tracks and one vernier track; consistent with the arrangement shown in FIG. 3. In this embodiment, guard tracks can be added between code tracks, where a guard track may be a transparent track having no opaque portions thereof. Eight narrow encoder tracks, nine narrow guard tracks, and a single wide vernier track may be used in this embodiment. Track dimensions may be adapted so that three photosensors are illuminated with each track. Therefore, the seventeen narrow guard and code tracks utilize 51 of the 128 photosensors. This leaves 77 photosensors for the vernier track. In a digital hard-limited embodiment, the 77 photosensor vernier track permits approximately one part per 77 resolution or approximately 1.3 percent resolution related to about 6-bit vernier resolution. The combination of 8-bit code resolution and 6-bit vernier resolution permits a 14 bit transducer. In a non-hard limited embodiment where photosensor analog amplitude is processed for the vernier processing (such as may be used with a regression computation), significantly greater vernier resolution than one part in 77 can be obtained. Analog resolution may be a function of the analog precision of the photoelectric components and the processing algorithm, which may provide a 4-times improvement, 8-times improvement, or even a 64-times improvement over the one part in 77 resolution associated with a hard-limited transducer arrangement.

Further, a linear scale can be provided as an improvement over the more conventional linear scales. For example, linear scales typically provide for translation of one optical or magnetic device relative to another optical or magnetic device and for monitoring signals indicative of incremental progress along the scale. A linear transducer in accordance with the present invention can translate array 244 relative to an arrangement of slits 240 (FIGS. 2C and 2D) which can be arranged on a linear track instead of the circular slitted track 232 discussed elsewhere herein. For example, the arrangement of slits 240 can be photochemically produced on a linear glass plate and used to expose array 244 which is translated past the slit arrangement. Such a linear modification of the rotational transducer can be implemented by one skilled in the art from the teachings herein, particularly relative to the rotational vernier transducer teachings herein.

For simplicity of discussion, the arrangements shown relative to FIGS. 2C and 2D have array dimensions of eight elements. In alternate embodiments, arrays having different quantities of elements can be used. For example, array dimensions may have 64 elements, 128 elements, 256 elements, 512 elements, or other numbers of elements. Single dimensional linear arrays having 64 through 10,000 elements are available in single dimensional line arrays and two dimensional area arrays from Reticon Corp and from Fairchild Semiconductor; wherein data sheets therefore are referenced hereinafter.

In an illustrative embodiment, optical device 210 has been described as being mounted on shaft 211 in a rotary shaft position transducer. In an alternate embodiment, optical device 210 can be mounted between moving devices such as transmitting or rotating devices, can be a linear device, or can otherwise be mounted for sensing relative motion. Transducer 118 is described for providing relative physical motion between optical device 210 and illumination sensor 215. In alternate embodiments, other types of optical motion can be utilized. For example, optical rotational effects such as Moiré optical effects, holographic effects, and other such effects can provide relative optical motion as an alternate to the relative physical motion discussed with reference to FIG. 2A.

For simplicity of discussion, an arrangement has been described herein having a whole number encoder implemented with a vernier in an integral manner, wherein the encoder and vernier are implemented with the same optical device 210. Alternately, combinations of whole number encoders, incrementel pickoffs, and verniers implemented in optical form or in other forms may be used in various combinations. For example, an incremental transducer and an integral vernier transducer can be implemented as discussed herein. Alternately, a whole number encoder with or without vernier can be implemented from the teachings herein. Various other combinations of these techniques may be implemented in various combinations thereof as either integral or nonintegral configurations.

Single dimensional linear array 235 and two dimensional rectangular array 236 are discussed herein relative to FIGS. 2C and 2D respectively. Other array configurations such as curved circular arrays, trapezoidal arrays, parabolic arrays, etc may be utilized; the utilization of which will become obvious to those skilled in the art from the teachings herein.

Significant advantages can be achieved by using the same array for different portions of the transducer. For example, the same array may be used for detection of whole number encoder signals and for detection of vernier signals from code wheel 210, where this integral array can be a single monolithic array. Such an integral array arrangement can provide reduced cost, size, and weight and increased precision. Use of such an integral array can reduce problems with alignment between different photosensors 215 and between photosensors and optical wheel 210.

Use of the same photosensor array for code wheel and vernier tracks permits tracks to be narrow, about the size of the one-thousandth inch photosensor dimensions; in contrast to prior art systems being tenths of an inch wide. This facilitates a very small transducer because of the very narrow tracks. This also facilitates a low cost transducer because of the use of an array instead of discrete photosensors and because a single illumination source can be used to illuminate a plurality of tracks simultaneously reducing the need for separate sources, fiber optics, etc. Reduction in the number of sources also provides greater reliability. Further, use of a single array for multiple tracks such as code wheel and vernier tracks enhances alignment, integration, etc and facilitates low cost and high accuracy. Various exemplary arrangements are discussed with reference to FIG. 2E herein.

An ultra-high precision motion transducer can be provided with the teachings of the transducer of the present invention. In one embodiment, use of a long linear array such as array 235 containing a large number of photosensors such as 1728 photosensors implemented on the Fairchild Model No. CCD 121H circuit or 1024 photosensors implemented on the Reticon Model No. RL 1024C circuit referenced hereinafter. A narrow slit oriented at a small angle such as an 0.0005 inch slit oriented at a ¼ degree angle from linear array 235 can provide ultra-high precision. The arrangement shown in FIG. 4A including converter 403 and processor 406 can be used for processing the linear array information such as with a linear regression routine or other interpolation routine to find the interpolated center position of slit 240 on single dimensional array 245 (FIG. 2C). Alternately, a two dimensional array arrangement such as discussed with reference to FIG. 2D herein can be used to implement an ultra-high precision motion transducer in accordance with various discussions herein.

The present invention has been described in the form of specific embodiments as being exemplary of the more generic features of the present invention. However, many alternatives may be provided which are implied from the teachings herein in view of the skill in the art. For example, a transducer embodiment having slits, code wheels, masks, and other arrangements for exposing photosensors has been discussed. However, other arrangements may be used individually or in combination including polar, graphic, moiré, projection, variable density filters, interference patterns, fraction patterns, and others in addition to or in place of slits. Similarly, photosensors have been discussed herein relative to CCD photosensors. However, other photosensor arrangements may be used including photo-transistors, photo-diodes, photo-cells, photoamplifier tubes, and other photo-sensors. Also, various signal processing arrangements have been discussed herein showing circuit components for processing signals. However, other arrangement may be used, such as computers including microcomputers, special purpose digital circuits, special purpose analog circuits, hybrid (analog and digital) circuits, CCD signal processors, SAW signal processors, and other signal processing arrangements.

In the photosensor arrangement discussed herein, a track may cover a plurality of photosensors. For example, a track may be a 1/10th of an inch wide and the photosensor array may have 1,000 photo-sensors per inch for 100 photo-sensors per track. This facilitates redundant sensing and processing for enhanced operation, reduced errors, and versatility. In addition, array dimensions may be greater then code track and vernier track dimensions, where the array may extend beyond the code and vernier tracks and where guard tracks on the inside and the outside of disk 210 may be used to bound, synchronize, or define limits of the position sensing tracks. For example, shifting the photo-sensor array may first present signals from an outer guard track, then may present signals from vernier tracks, then may present signals from code tracks, and then may present signals from guard tracks. Electronics can synchronize guard track signals for monitoring vernier and code track signals, such as with preambles and postambles used for communication systems.

Guard tracks may also be used inbetween code tracks and vernier tracks. A guard track may be a continuously illuminated transparent track, a continuously opaque track, a sequence of transparent and opaque tracks providing a guard track code, or other such arrangement.

In a preferred embodiment discussed herein, a vernier track is provided as an outer track and code tracks are provided as inner tracks having increased weighting from outer code tracks to the inner code tracks. However, other arrangements thereof may also be provided such as having vernier tracks on inner tracks and code tracks as outer tracks, vernier tracks inbetween code tracks, code tracks being located in different sequences than in increased binary weighing sequences from outer tracks to inner code tracks, and other arrangements thereof.

Although the present invention is discussed with reference to a multi-track wheel 210 having fixed tracks, alternate embodiments may be used having non-fixed tracks. For example, code tracks 239 may be superimposed together on an electro-optical arrangement that can sequentially change the track patterns for sequential readouts of codes. For example, a track can be implemented with liquid crystal material having code segments thereon, where the plurality of code tracks may be generated sequentially with a single track under electro-optical control of the liquid crystal material. The segment pattern for an LSB track may be selected first, the segment pattern for a second LSB track may be selected next, and the segment patterns for other progressively more significant bit tracks may be selected in sequence; propogating towards the most significant bit track. A photo-sensor may monitor the progression of code patterns from the single track as the pattern changes from the LSB to the MSB, or alternately from the MSB to the LSB, or alternately in another sequence which may be a random access sequence. Therefore, a plurality of patterns may be implemented on a single track and each pattern may be electrically selected, either individually or in sequence, to obtain the desired output signal.

In the related applications, reference signals are discussed in the embodiment of generating electrical reference signals such as scale factor and bias reference signals and storing them in a memory. Alternately, reference signals such as scale factor and bias signals may be generated photo-optically and stored in the memory. For example, an unexposed track having an opaque code element for generating a bias reference signal and having a fully exposed transparent track for generating a scale factor reference signal may be provided. Such opaque and transparent tracks are consistent with the generation of opaque and transparent segments on a track discussed for the code wheel herein. Reference signals may be introduced in other areas such as from an analog ROM storing reference signals, electrically introducing reference signals, photo-optically introducing reference signals, and otherwise introducing reference signals.

Multiple Vernier Arrangements

A multiple vernier arrangement will now be discussed with reference to FIG. 2B. Vernier 232 can be a single track vernier or a multiple track vernier. Each track can be implemented as discussed relative to FIGS. 2C and 2D and elsewhere herein. A multiple track vernier arrangement will now be discussed relative to FIG. 2B herein. In this embodiment, different vernier tracks can have different resolutions therebetween, where a first vernier track 232B can have a most significant digit (MSD) vernier and a second vernier track 232A can have a least significant digit (LSD) vernier. As discussed above for different resolutions of code tracks 231 and first vernier track 232, a plurality of vernier tracks can be provided having different resolutions, where finer resolution vernier tracks can interpolate inbetween resolution increments of coarser resolution vernier tracks. For example, a coarse vernier track 232B can have a resolution limited by the implementation of the track, array, electronics and interpolation of array outputs. Each resolution increment of coarse vernier tracks 232B can be interpolated with a finer vernier track 232A to provide greater resolution. For example, in the arrangement discussed with reference to FIGS. 2C and 2D above, an eight bit encoder arrangement having eight tracks 231 provides a resolution of one part in 256 or 256 least significant bit (LSB) patterns on outer code track 239 and provides one vernier slit on coarse vernier track 232B for each least significant bit code pattern on outer code track 239 for 256 slits on coarse vernier track 232B. Assuming that coarse vernier track 232B can provide six bits of resolution or one part in 64 resolution, a fourteen bit arrangement (one part in 16,384) can be provided with eight bit resolution code 231 and with six bit resolution coarse vernier 232B.

In an illustrative higher resolution arrangement utilizing dual vernier tracks, the above described eight-bit encoder and six-bit coarse vernier arrangement can be used in conjunction with a fine vernier arrangement such as having five-bit resolution in this illustrative example for still greater resolution. In this illustrative embodiment, a plurality of slits can be provided on fine vernier track 232A having finer resolution than coarse vernier tracks 232B. For example, fine vernier track 232A can have a slit for each resolution increment of coarse vernier track 232B in the same manner that coarse vernier track 232B has a slit for each resolution increment of code track 231. In this illustrative embodiment, fine vernier track 232A can provide a resolution of five bits or one part in 32, yielding a total vernier resolution of eleven bits or one part in 2,048 and a yielding a total transducer resolution of nineteen bits or one part in 524,288 (one part in 32 fine vernier resolution, times one part in 64 coarse vernier resolution, times one part in 256 code resolution). In this embodiment, just as each resolution increment of code tracks 239 has a coarse vernier slit on coarse vernier track 232B, each resolution increment of coarse vernier track 232B has a fine vernier slit on fine vernier track 232A. Therefore, each six bit resolution vernier slit of coarse vernier track 232B has 64 fine vernier slits on fine vernier track 232A. For this embodiment, fine vernier slits on track 232A may be at an angle of approximately 1.6 percent of the angle of coarse vernier slits on track 232B to facilitate the greater resolution and the scaling of this illustrative embodiment. For the embodiment having array 244 at zero degrees from radial 245 and coarse vernier slits on track 232B having an eight degree angle to radial 245, fine vernier slits on track 232A can have approximately ⅛ degree angle with radial 245 (six-bits resolution of an eight degree angle or 1/64 of an eight degree angle). For this illustrative example, there will be 64 fine vernier slits for each coarse vernier slit and 256 coarse vernier slits around coarse vernier track 232B, yielding 16,384 fine vernier slits per rotation (64 fine vernier slits per coarse vernier slit times 256 coarse vernier slits per rotation). In one embodiment, fine vernier slits can be registered with coarse vernier slits just as coarse vernier slits are registered with code patterns on LSB track 239; where the start of a new LSB code pattern on track 239 will be lined up with the start of a new coarse vernier slit on track 232B and the start of a new fine vernier slit on track 232A.

Fine vernier slits on track 232 can have the same dimensions and length as coarse vernier slits on track 232B or can have different widths and/or lengths. For example, fine vernier slits and coarse vernier slits can each have an 0.001 inch width, consistent with an 0.001 inch array element dimension. Alternately, coarse vernier slits and fine vernier slits can have different widths which can be greater than, equal to, or less than array element dimensions and can include combinations thereof for combinations of vernier slits on different vernier tracks. Similarly, vernier slits can have the same length, can have different lengths, can have the same relation to an array, and can have different relations to an array; such as discussed above with reference to FIGS. 2C and 2D. Also, arrays associated with different tracks can be the same array, can be different but similar arrays, or can be different arrays. For example, a single linear array can be used for sensing code signals from tracks 231, coarse vernier signals from track 232B, and fine vernier signals from track 232A. Alternately, different arrays may be used for each track or for various combinations of tracks including code tracks 231, coarse vernier track 232B, and fine vernier track 232A. Arrays can be the same type of array, can be different types of arrays, and can be mixtures of the same type of array and different types of arrays. For example, different single dimensional arrays 235 can be used having different lengths, different dimensions, different orientations, different mountings, etc. Also, different arrays used in combination can include combinations of linear single dimensional arrays and two dimensional arrays. Many other combinations and alternates can be provided based upon the exemplary features described herein.

In another exemplary embodiment, coarse vernier track 232B can have coarse vernier slits with an 0.001 inch width at an eight degree angle from radial 245 and fine vernier track 232A can have fine vernier slits with an 0.0005 inch width at a ⅛ degree angle from the radial 245. Many alternate combinations of slit width, tilt, angle, length, etc can be provided based upon the illustrative features.

A multiple vernier arrangement 280 will now be discussed with reference to FIG. 2E. Arrangement 280 comprises (a) a plurality of code tracks 231, (b) a coarse vernier track 283, (c) a middle vernier track 282, and (d) a fine vernier track 281. Various array arrangements are provided, where a single array 285 parallel (or at an angle) with the radial direction or multiple array elements 286 at angles to the radial direction can be used. For simplicity of illustration, the resolution of vernier tracks 281-283 is shown as limited, where only four middle vernier track slits 282 are provided for each coarse vernier slit 283 and where only four fine vernier slits 281 are provided for each middle vernier slit 282. This arrangement illustrates an embodiment where code tracks 231 and slits of vernier tracks 281-283 are all lined up to "start" at the same place, such as at positions 287 and 288. Alternately, various tracks can be staggered in various ways to facilitate different implementations. Also, alternate embodiments of single array 285 and multiple arrays 286 are provided to illustrate alternate embodiments and to exemplify embodiments where an array is provided parallel to the radial direction and at an angle to the radial direction. Further, the multiple vernier track arrangement in combination with the code track arrangement is used to illustrate a general representation of code tracks and vernier tracks to exemplify implementations with code tracks implemented without vernier tracks, with a single vernier track implemented without code tracks, with code tracks implemented in combination with one or more vernier tracks, with multiple vernier tracks implemented together without code tracks, and with other alternate embodiments that can be derived from this generalized example.

Code tracks 231 comprise LSB track 231A, next more significant LSB track 231B, and other code tracks as may be required. For this example, eight code tracks 231 will be considered for a resolution of one part in 256. Coarse vernier track 283 is shown implemented with a slit having a range of one LSB code track increment, similar to the other arrangements discussed herein. Middle vernier track 282 is shown implemented with four slits for each slit of coarse vernier track 283. Fine vernier track 281 is shown implemented with four slits for each slit of middle vernier track 282. In a preferred embodiment, greater vernier resolution can be obtained then the one part in four resolution illustrated in FIG. 2E, but practical levels of resolution such as one part in 64 would necessitate 64 middle vernier slits for each coarse vernier slit and 4,096 fine vernier slits per coarse vernier slit; which would detract from the illustrative nature of the figure. Therefore, a more limited configuration is shown in FIG. 2E to enhance illustration of the principles herein.

For the single array arrangement using array 285, all of the optical information can be loaded or multiplexed into array 285 and can be separated and processed with transducer electronics 111. Effectively, the information from all code tracks and all vernier tracks are multiplexed into array 285 and multiplexed information is shifted out of array 285. Demultiplexing can be performed with special purpose electronics, with a stored program computer, or with other techniques. Demultiplexing with special purpose electronics can be performed with switching logic and circuitry for loading different portions of the array signals into different registers. Demultiplexing in a stored program computer can be performed by converting and loading array samples with converter 403 into processor 406 (FIG. 4A), where processor 406 can separate or demutiplex the various portions of the mutiplexed array signals.

A separate array arrangement 286 can provide separate arrays 286A-286D for sensing illumination processed with different tracks of the transducer. For example, array 286A is shown sensing illumination from code tracks 231, array 286B is shown sensing illumination from the coarse vernier track 283, array 286C is shown sensing illumination from middle vernier track 282, and array 286D is shown sensing information from fine vernier track 281. In this embodiment, the information from each array 286A through 286D can be accessed independent of the information from other arrays and therefore can be processed independently. The use of separate arrays can effectively provide demultiplexed photosensor information.

The arrangement shown in FIG. 2E provides an 18 bit (one part in 262,144) resolution transducer. For example, this arrangement provides eight code tracks 231 for an eight bit (one part in 256) resolution, two bit (one part in resolution coarse vernier track 283, two bit (one part in four) resolution middle vernier track 282, and six bit (one part in 64) resolution fine vernier track 281. The 18 bit resolution of this transducer is based upon eight bit code tracks, a two bit coarse vernier track, a two bit middle vernier track, and a six bit fine vernier track; yielding a resolution of one part in 262,144. The two bit resolution of coarse vernier track 283 is implicit in the four middle vernier slits of middle vernier track 282 for each coarse vernier slit of coarse vernier track 283. Similarly, the two bit resolution of middle vernier track 282 is implicit in the four fine vernier slits of fine vernier track 281 for each middle vernier slit of middle vernier track 282.

In view of the above, various combinations of code tracks and/or vernier tracks have been provided as illustrative of various embodiments of the transducer of the present invention.

SIGNAL PROCESSING

One embodiment for processing of detection signals 114 with transducer electronics 111 will now be discussed with reference to FIG. 4A. Signal 114 from detector 110 (FIG. 1 and FIG. 2A) can be processed with an analog to digital (A/D) converter 403 generating digital samples 404 under control of synchronization signal 405. Processor 406 processes digital samples 404 to generate output signals 407. Converter 403 may be a whole number converter, a squaring amplifier, or other such device to convert analog signals to digital signals. A/D converter 403 can be synchronized with shifting of array signals. Sync signal 405 can be synchronized with an array shifting signal. Processor 406 can be a special purpose digital processor, a general purpose digital computer such as a microcomputer, or other such processor. In an alternate embodiment, processor 406 can be an analog or a hybrid processor which may not require converter 403. Signals 407 may be output electrical signals 116 (FIG. 1) for controlling a servo or other device. Alternately, signals 406 can be used to control display devices or other devices for generating non-electrical signals 117 (FIG. 1). Processor 406 can perform vernier processing, anti-ambiguity processing, and other processing. Further, processor 406 can perform "least squares fit", regression, and curve fit processing, discussed herein. Processor 406 can also perform other processing, as needed.

Linear interpolation can be provided with processor 406 based upon well known methods such as linear regression processing to determine the interpolated center position of slits 240 on array 244 (FIGS. 2C and 2D). Various interpolation processing statistical processing, filtering processing, averaging processing, and other processing can be implemented with processor 406 (see FIG. 4B and see parent U.S. Pat. No. 4,209,843) to derive the vernier position from slits 240 exposing array 244 (FIG. 2C and FIG. 2D) for obtaining transducer signals 115 (FIGS. 1 and 2A).

An illustrative embodiment of a signal processing arrangement will now be discussed with reference to FIGS. 1, 2, and 4; particularly with reference to the single-dimensional line array 235 and slit 240 arrangement discussed herein with reference to FIG. 2C. Photosensors 215 (FIG. 2A) in detector 110 (FIG. 1) can be a photosensor array 244 (FIGS. 2C and 2D) having sequential photosensor output signals 114 (FIG. 2A) representing a sequence of photosensor signals in sequential form.

Signal 114 is accessed from array 215 under control of a gated clock signal from gate 428 and is processed with signal processing electronics 111 (FIG. 4B). In one illustrative embodiment, array signal 114 is processed with compensation circuit 413 to generate compensated array signals 414. Compensation circuit 413 can be implemented with a reference signal arrangement such as discussed in related patent applications Ser. No. 552,559; Ser. No. 550,231; Ser. No. 844,765; and Ser. No. 889,301 referenced herein.

Compensation circuits 413 can be implemented with a sample and hold circuit to sample a reference signal and a compensation circuit to compensate uncompensated array signals 114 to generate compensated array signals 414. Compensation circuit 413 can provide scale factor compensation, bias compensation, linearity compensation, and other compensation discussed in said related patent applications. The reference signal can be derived from the reference photosensors in array 215, where a first reference photosensor can be continually exposed to illumination through a fully transparent track without any opaque portions to provide a scale factor reference signal, a second photosensor can be unexposed to illumination through a fully opaque track without any transparent portions to provide a bias reference signal, and other tracks can be provided having other characteristics for providing other reference signals. These reference signals can be obtained from different portions of the array such as near the output end of the array, near the farthest portion from the output end of the array, etc to obtain different degradation parameters such as parameters related to the number of shift stages traversed. The reference signals can be processed in various manners such as described in said related paten applications. Signal 414 is processed with squaring circuit 415 which squares-up analog sensor signals 114 to generate a digital output signal 426.

Digital signal 426 is shifted into shift register 416 under control of a gated clock signal from gate 429. As squared up array signal 426 is shifted into shift register 416, parallel output signals from each stage of register 416 are summed with resistors 417 connected to summing junction 418. Sum signals 418 are processed with differentiator circuit 419 to provide differentiated signal 420. Signal 420 from differentiator 419 is processed with squaring circuit 421 to provide squared-up differentiated signal 422, which is used to clock flip-flop 423. Flip-flop 423 is shown as a reset-set (RS) flip-flop having set input S connected to a "zero" or ground condition, reset input R connected to a "one" or $V_{CC}$ condition, clock input CK connected to squared-up differentiated signal 422, and preset input P connected to shift enable signal 430 through one-shot 431. Output flip-flop signal 424 from flip-flop 423 controls counter 425 as a countenable signal. Output signals 115 from counter 425 can be a digital output word representative of the transducer vernier position. Busy signal 424 is indicative of the stability of output signals 115. Control circuit 427 generates shift enable signal 430 to gate a clock signal to array 215 with gate 428, to gate a clock signal to register 416 with gate 429, and to preset flip-flop 423 with one-shot circuit 431.

Signals 114 and 414 from array 215 are similar to each other, wherein signal 414 is a compensated version of signal 114. Signals 114 and 414 are shown in simplified form in FIG. 4C. Optical samples sensed with array 215 are sequentially shifted onto line 114, having a null amplitude from time T0 to time T1 indicative of non-illuminated photosensors at the bottom of the array, having an analog amplitude from time T1 to time T3 indicative of array sensors being illuminated through slits 240 (FIGS. 2C and 2D), and having a null amplitude from time T3 to time T4 indicative of non-illuminated photosensors at the top end of the array. The vertical lines inbetween time T1 and time T3 are indicative of the analog amplitudes of signals 114 and 414 being sampled amplitudes consistent with the sampling nature of photosensor array signal generation.

Analog signal 414 is squared-up with squaring circuit 415 to generate squared-up photosensor signal 426 (FIG. 4D). Squared-up samples 426 are shifted into register 416 and summed with summing resistors 417. In one embodiment; resistors 417 can be binary weighted resistors increasing in weighting and then decreasing in weighting from resistor 455 through resistor 456 to provide a weighted envelope similar to array output envelope 114. Signal 418 will increase in amplitude as squared-up samples 426 are shifted into register 416 and will decrease in amplitude as squared-up samples 426 are shifted out of register 416; as shown in FIG. 4E. A peak will occur when squared-up samples 426 have been shifted into the middle portion of register 416 connected to resistors 417 having the greatest weighting. Further shifting causes signal 418 to decrease in amplitude until all of the squared-up samples 426 are shifted out of register 416. Differentiator 419 differentiates signal 418 to generate differentiated signal 420, which is processed with squaring circuit 421 to generate squared-up differentiated signal 422 (FIG. 4F) having a positive transition at the start of squared-up array signals 426, having a negative transition at the completion of squared-up array signals 426, and providing an average over the plurality of squared-up array signals 426. This averaging or filtering permits signal processing electronics 111 to be relatively insensitive to variations between photosensors, degradation of photosensors, noise, and other such considerations. This insensitivity permits inexpensive arrays having degraded characteristics and even rejected arrays that are inadequate for usual applications to be used for providing a lower cost transducer system.

Flip-flop 423 generates count enable signal 424 starting at the beginning of a shift frame at time T0 and continuing until the negative transition of signal 422. This is accomplished by presetting flip-flop 423 at the start of shift enable signal at time T0 430, resetting flip-flop 423 by clocking with the negative transition of signal 422 at time T3 with a true or $V_{CC}$ condition at reset input R of flip-flop 423. Count enable (busy) signal 424 from flip-flop 423 controls counter 425 to count time from T0 through T3 as indicative of the position of the vernier slit along array 215. After counter 425 has been disabled by signal 424 going low, busy signal 424 going low can be used to enable loading of output signals 115 from counter 425 to output devices 112 (FIG. 1), which output signals 115 are stable when busy signal 424 is low.

As slits 240 traverse from the bottom photosensor 250 to top photosensor 257 (FIG. 2C); signals 114, 426, 418, and 422 (FIGS. 4C-4F) progress towards the right from the condition where time T1 is coincident with time T0 towards the condition where time T3 is coincident with time T4 (FIGS. 4C-4F). Therefore, the time between time T0 and time T3 (FIGS. 4C-4F); which is measured by counter 425 counting time from time T0 to time T3, providing this time period as signals 115 and being stable when busy signal 424 is low is indicative of the position of slit 240 along array 235 (FIG. 2C) and therefore represents a vernier position of transducer 118.

An illumination compensation arrangement will now be discussed with reference to FIGS. 2A and 4G. As discussed with reference to FIG. 2A herein, illumination source 212 generates illumination such as illumination 213 incident upon optical wheel 210 to generate illumination 214 with optical wheel 210 to expose array 215. Array signal 216 can be amplified with amplifier 217 to generate detector signal 114. Signal 114 can be used as a feedback signal and can be compared with command signal 437 using comparator 436 to generate servo comparison signal 438 to excite source 430. A more detailed description of such an illumination servo arrangement is provided in related applications Ser. No. 366,714; Ser. No. 860,278; and Ser. No. 152,105; all referenced herein. Elements 430, 432, and 434 (FIG. 4G) can correspond to elements 212, 215, and 217 (FIG. 2A) respectively. Signals 433 and 435 (FIG. 4G) can correspond to signals 216 and 114 (FIG. 2A) respectively. Illumination 431 (FIG. 4G) can correspond to illumination 213 incident on optical wheel 210 or illumination 214 generated by optical wheel 210 (FIG. 2A). In one embodiment, photosensor 432 (FIG. 4G) represents a separate photosensor independent of array 215 (FIG. 2A) having separate circuitry 434 and 436 for exciting source 430. In an alternate embodiment, photosensor 432 (FIG. 4G) can be included in array 215 (FIG. 2A), as discussed in said related patent applications; where this combined illumination feedback and array arrangement is discussed in greater detail hereinafter.

The illumination feedback arrangement shown in FIG. 4G can be integral with the transducer photosensor arrangement shown in FIG. 2A. Photosensor 432 can be included in array 215 such as being a photosensor exposed through an illumination compensation track of optical wheel 210. This illumination compensation track can be a fully transparent track without any opaque segments, thereby providing continual exposure of photosensor 432 in array 215. Therefore, output signal 216 from array 215 may include output illumination calibration signal from photosensor 432. This illumination compensation signal can be sampled with a sample and hold circuit such as discussed for the CCD array compensation arrangement herein and in the related patent applications associated therewith. The sample and hold circuit storing the illumination compensation reference signal can be considered to be part of amplifier 432 or can be considered to be inserted in signal line 435 inbetween amplifier 434 and comparison circuit 436 (FIG. 4G). A command signal 437 can be generated from external circuitry, as discussed in said related patent applications, or can be a fixed voltage such as a bias voltage to establish illumination intensity. Comparison circuit 436 can include a differential amplifier and a power amplifier for generating source control signal 438 to control source 430 to provide the desired illumination intensity.

Use of redundant illumination sources are discussed in related patent applications Ser. No. 366,714 and Ser. No. 860,278 such as with reference to FIG. 10 therein. Such a redundant source arrangement as discussed therein can be used in the transducer of the present invention.

The integrated circuit microcomputer of the referenced patent applications may be used in combination with the encoder described herein. In one embodiment, the microcomputer may be external to the encoder case. In another embodiment, the microcomputer may be mounted within the encoder case for providing processed digital output signals from the encoder. In a preferred embodiment, a microcomputer for use with an encoder is a single chip microcomputer as disclosed and claimed in parent applications Ser. No. 101,881 and Ser. No. 860,253. However, multiple chip microcomputers may also be used in this application. The microcomputer can be used to process the encoder signals to provide motion information such as position, velocity, and acceleration for the encoder readings and changes in these encoder readings and can also provide other information such as the servo steady state position error. Also, other information may be obtained from other sensors such as temperature, pressure, illumination intensity and other parameters that may be monitored by the microcomputer.

Processing of photo-optical signals in the embodiment of a photo-optical reader and the alternate embodiment of a photo-optical encoder are provided in referenced application Ser. No. 879,293. Use of a microcomputer in conjunction with a photo-electric tape reader and in conjunction with a motion transducer is discussed in referenced application Ser. No. 101,881. Other referenced applications provide further details on use of the encoder of the instant application.

Interfacing of a transducer to a microcomputer may be provided with various input/output arrangements well known in the microcomputer art or may be provided with the arrangements discussed in the related patent applications referenced herein. For example, the related applications disclose serial input and serial output logic using a gated clock pulse, which may be used with the serial register nature of the CCD photosensors discussed herein. Said related patent applications also provide parallel input/output channels, which may be used with parallel input and output photosensor arrangements. Many other microcomputer input and output arrangements are disclosed therein and may be used with the transducer disclosed herein.

Temperature Compensation

Temperature sensitivity of devices introduces errors. For example, temperature sensitivity of electronic components causes drift and variation as a function of temperature. Therefore in accordance with another feature of the present invention, a temperature compensation arrangement will now be discussed.

Temperature compensation can be achieved with the adaptive illumination compensation arrangement discussed with reference to FIG. 4G and the array compensation arrangement such as discussed with reference to circuitry 413 (FIG. 4B). These compensation arrangements provide compensation for temperature variations affecting illumination characteristics and array characteristics. Further, temperature control can further reduce temperature related errors. A temperature control arrangement is discussed with reference to FIG. 4H. In one embodiment, a closed loop servo arrangement can be used for temperature control, as shown in FIG. 4H. In another embodiment, temperature control can be implemented with a digital processor such as a stored program computer. In yet another embodiment, temperature compensation can be provided by sensing the temperature and computationally compensating transducer signals without actually controlling the temperature.

In the closed loop servo arrangement shown in FIG. 4H, a temperature sensor 442 senses temperature 411 and controls a servo loop comprising amplifier 444 and comparator 446 to control heating and cooling devices 440 to control temperature of the transducer. Well known temperature sensors can be used for temperature sensor 442. Temperature sensor 442 generates sensor signal 443 to amplifier 444. Amplifier 444 generates amplified sensor signal 445 for comparison with command signal 447 using comparator 446 to generate control signal 448. Control signal 448 controls heating and cooling device 440 for generating heating and cooling 441 to thermally control the motion transducer. Amplifier 444 and comparitor 446 can be implemented as discussed with reference to the illumination control arrangement in FIG. 4G. Thermal device 440 can include well known heating and cooling elements. For example, device 440 can be a well known arrangement such as a heating coil, Peltier cooler, thermo-electric device, or other arrangement. In other arrangements, the thermal control circuit of FIG. 4H can be implemented with well known heating and air conditioning arrangements such as thermostatically controlled arrangements.

As an alternate arrangement to FIG. 4H, sensor signal 443 or amplified sensor signal 445 (FIG. 4H) can be converted to digital form with A/D converter 403 and input to processor 406 for processing thereof such as being multiplexed into signal line 114 with well known multiplexing techniques (FIG. 4A). Processor 406 can process the digitized temperature sensor signal for control of thermal device 440 (FIG. 4H) or for temperature compensation of transducer signals. In the temperature control arrangement, processor 406 can generate signals 407 to control temperature control element 440. Signals 407 can be generated as pulse modulated signals for directly controlling thermal control device 440; or can be generated as digital signals to drive a well known D/A converter to generate an analog signal to excite thermal control device 440; or can be used in various well known arrangements to facilitate temperature control. Pulse modulated control and D/A converter control are discussed in the related patent applications referenced herein relative to illumination control and machine control.

Processor 406 can process transducer signals in response to the temperature sensor signal in order to compensate the transducer signals for temperature sensitivities. This control can be implemented in various arrangements. For example, temperature compensation can be implemented by storing a table of temperature sensitivity parameters in a memory contained in processor 406. The parameters in the table can be derived analytically of emprically by measuring inherent temperature sensitivities of the circuits. Processor 406 can perform a table lookup operation directed by the temperature signal that is derived from the temperature sensor to obtain a temperature sensitivity compensation parameter from the table for compensating the transducer signals.

Other Aplications

The transducer of the present invention has been described in the illustrative embodiment of a motion transducer. Various other applications will now be discussed to illustrate the broad range of applicability of this transducer.

The transducer of the present invention provides a very efficient means and method for measuring relative motion. For example, relative motion between slits 232 and array 244 can be efficiently determined. Therefore, any transducer or apparatus that provides relative motion, even minute relative motion, may utilize the features of the present invention. Various embodiments will now be discussed.

A pressure transducer can be implemented with the present invention. For example, pressure can be converted to relative motion with well known devices and relative motion can be sensed with the transducer discussed herein. One such device can include a diaphram, bellows, etc.; the shape of which is changed as a function of pressure. One such bellows is utilized in conventional anaroid barometers. Use of slits 232 in conjunction with a device such as a moving diaphram, etc. can cause exposure of array 244 for measuring motion of the device and therefore pressure. Illumination transmissive methods can be used, as illustrated with the arrangement shown in FIG. 2. Alternately; reflective, interference, etc. arrangements can also be used. Therefore, a device for monitoring pressure that causes motion in response to pressure can use the teachings of the present invention.

An electrical transducer such as a galvanometer can be implemented with the present invention. For example, electrical signals can be converted to relative motion with well known devices and relative motion can be sensed with the transducer discussed herein. One such device can include a mirror, etc.; the orientation of which is changed as a function of an electrical signal. One such mirror is utilized in conventional galvonemeters. Use of slits 232 in conjunction with a device such as a moving mirror, etc. can cause exposure of array 244 for measuring motion of the device and therefore the electrical signal. Illumination reflection methods can be used. Alternately, transmissive, interference, etc. arrangements can also be used. Therefore, a device for monitoring electrical signals that causes motion in response to pressure can use the teachings of the present invention.

A temperature transducer can be implemented with the present invention. For example, temperature can be converted to relative motion with well known devices and relative motion can be sensed with the transducer discussed herein. One such device can include a bimetal strip, etc. the shape of which is changed as a function of temperature. One such device is utilized in conventional thermostats. Use of slits 232 in conjunction with such a moving device can be used to expose array 244 for measuring motion of the device and therefore the temperature. Illumination transmissive methods can be used, as illustrated with the arrangement shown in FIG. 2. Alternately; reflective, interference, etc. arrangements can also be used. Therefore, a device for monitoring temperature that causes motion in response to temperature can use the teachings of the present invention.

A fluid flow transducer can be implemented with the present invention. For example, fluid flow can be converted to relative motion with well known devices and relative motion can be sensed with the transducer discussed herein. One such device can include a spring loaded lever, etc.; the position of which is changed as a function of flow. Use of slits 232 in conjunction with such a moving lever, etc. can cause exposure of array 244 for measuring motion of the device and therefore flow. Illumination transmissive methods can be used as illustrated with the arrangement shown in FIG. 2. Alternately; reflective, interference, etc. arrangements can also be used. Therefore, a device for monitoring flow that causes motion in response to flow can use the teachings of the present invention.

A level transducer can be implemented with the present invention. For example, fluid level can be converted to relative mot with well known devices and relative motion can be sensed with the transducer discussed herein. One such device can include a float, etc.; the position of which is changed as a function of fluid level. One such float is utilized in conventional automotive carburetors. Use of slits 232 in conjunction with a device such as a moving float, etc. can cause exposure of array 244 for measuring motion of the device and therefore the fluid level. Illumination transmissive methods can be used, as illustrated with the arrangement shown in FIG. 2. Alternately, reflective, interference, etc. arrangements can also be used. Therefore, a device for monitoring fluid level that causes motion in response to fluid level can use the teachings of the present invention.

A weight transducer can be implemented with the present invention. For example, weight can be converted to relative motion with well known devices and relative motion can be sensed with the transducer discussed herein. One such device can include a balance, etc.; the position of which is changed as a function of weight. One such balance is utilized in conventional weight scales. Use of slits 232 in conjunction with a device such as a moving scale, etc. can cause exposure of array 244 for measuring motion of the device and therefore weight. Illumination transmissive methods can be used, as illustrated with the arrangement shown in FIG. 2. Alternately; reflective, interference, etc. arrangements can also be used. Therefore a device for monitoring pressure that causes motion in response to pressure can use the teachings of the present invention.

A photo-optical punched tape reader can be implemented with the present invention. For example, punched tape can have relative motion using well known punched tape reader devices and tape relative motion can be sensed with the transducer discussed herein. One such device can include a punched tape reader for transporting a punched tape past a photo-optical transducer. Use of slits 232 in conjunction with a device such as a moving punched tape, etc. can cause exposure of array 244 for detecting punched holes in the tape. Illumination transmissive methods can be used, as illustrated with the arrangement shown in FIG. 2. Alternate reflective, interference, etc. arrangements can also be used. Therefore, a device for reading a punched tape can use the teachings of the present invention.

Availability of a low cost encoder as described herein facilitates many novel uses thereof. These novel uses may be exemplified with an operator control panel selector switch embodiment, discussed below. Selector switches are used in the prior art for selecting one of a plurality of positions. These selector switches have mechanical contacts and have relatively poor resolution. Resolutions of 10 to 20 positions is often provided. However, use of an optical encoder in place of a selector switch facilitates greater switch position resolution and greater reliability. For example, a 256 position selector switch may be provided with an 8-bit encoder. Also, reliability of an optical encoder may be greater than reliability of a mechanical selector switch.

Prior art selector switches have switch positions noted on the panel such as with silk-screened legends. However, a large number of positions, such as 256 positions, may be confusing if noted on the panel in the usual manner. Therefore, a digital readout such as a binary, decimal, hexadecimal, or other digital code may be provided. This readout may be implemented with discrete display elements such as light emitting diodes (LEDs) or in other ways, such as with a numerical decimal display. Therefore, display readouts can be used for providing encoder position to an operator in place of the prior art legends placed on the control panel.

In view of the above, the teachings of the present invention can be used for many different types of transducers sensors, etc; where the above described alternate embodiments are illustrative of the multitudes of different types of applications thereof.

Integral Transducer

For simplicity of discussion, the system of the present invention has been discussed in the form of a discrete transducer, such as illustrated in FIGS. 1 and 2. In alternate embodiments, the present invention can be implemented in an integral form, wherein the transducer may not appear as a discrete transducer element. For example, slits 232 can be an integral part of a first moving element and array 244 can be mounted in conjunction with or be made an integral part of a second moving element providing relative motion therebetween (FIGS. 2C and 2D). Various illustrative embodiments will now be discussed.

The arrangement shown in FIG. 2 uses slits 232 as part of a moving member of a machine and uses array 244 as an integral part of or mounted on another part of a machine having relative motion therebetween. In this integral arrangement, shaft 211 may not exist as a transducer shaft; wherein relative motion may be facilitated by the structure of the machine elements having relative motion therebetween and wherein the structure specifically dedicated to the transducer may be minimal or non-existent.

Another integral arrangement may be an alignment arrangement such as discussed in the section entitled Alignment Embodiment herein.

An integral transducer can be provided for an inertial platform having relative motion such as motion between gimballed structures. As shown in FIG. 2, optical pattern 232 mounted on or integral with a first structural member may be caused to move relative to array 244 mounted on or integral with a second structural member having relative motion therebetween. Therefore, relative angular motion of the inertial platform can be determined from the output of array 244.

An integral transducer can be provided for a gyroscope having relative motion such as motion between the rotor and the case. As shown in FIG. 2, optical pattern 232 mounted on or integral with a first structural member may be caused to move relative to array 244 mounted on or integral with a second structural member having relative motion therebetween. Therefore, relative angular motion of the gyroscope can be determined from the output of array 244.

An integral transducer can be provided for a machine tool having relative motion such as motion between moving members thereof. As shown in FIG. 2, optical pattern 232 mounted on or integral with a first structural member may be caused to move relative to array 244 mounted on or integral with a second structural member having relative motion therebetween. Therefore, relative translational or angular motion of a machine tool can be determined from the output of array 244.

In view of the above, the teachings of the present invention can be used for many different types of integral embodiments; wherein the above described alternate embodiments are illustrative of different types of applications thereof.

Alignment Embodiment

The present invention may be used for providing alignment. Alignment generally involves the positioning of one element relative to a second element. The out-of-alignment condition can be represented as a displacement in a single dimension or in multiple dimensions. The teachings of the present invention can be used to measure and perform alignment. For example, alignment of slits 232 relative to array 244 can be measured with the output signal from array 244, as discussed herein. For example, as slit 242 is aligned or misaligned with array 244, the output signal from array 244 will indicate the degree of alignment or misalignment. A multi-dimensional alignment arrangement can be provided with the arrangement discussed in the section entitled Multiple-Dimensional Transducer.

Automatic alignment may be achieved by placing the alignment device shown in FIG. 2 in a closed servo loop, wherein such closed servo loops are discussed in the related applications. For example, the output of array 244 can be used to drive a servo motor for translating the device to be aligned having slits 232 attached thereto until slits 232 are properly positioned with reference to array 244, as indicative of alignment therebetween. Such alignment can be used for alignment of machine elements, photo-optical masks, etc. In a photo-optical mask embodiment, a mask such as an integrated circuit mask can be automatically aligned to a machine, wafer, etc. by having a vernier-type arrangement; the position of which is sensed with array 244 as indicative of the alignment. Such photo-optical mask alignment arrangements can be used with equipment that is well known in the integrated circuit, printed circuit, etc. technologies. Such techniques can be used with projection exposure equipment, contact exposure equipment, etc.

In view of the above, the teachings of the present invention can be used to facilitate alignment; either manually, semi-automatically or automatically; and to provide an indication of the degree of alignment such as with displays, etc.

Multiple-Dimensional Transducer

A multiple-dimensional transducer can be implemented with the system of the present invention. In one embodiment, a multiple-dimensional transducer can be implemented by combining a plurality of single-dimensional transducers. In an alternate embodiment, a multiple-dimensional transducer can be implemented with a single multiple-dimensional transducer element. Combinations and variations thereof will now become apparent to one skilled in the art from the teachings herein.

In accordance with FIG. 2C, a single-dimensional transducer can be used to determine motion in direction 246. Use of a second single-dimensional transducer oriented perpendicular to that shown in FIG. 2C along direction 245 can provide a two-dimensional transducer. Similarly, more than two dimensions can be provided by combining various single-dimensional and multiple-dimensional transducer elements.

A two-dimensional array 244, 236 has been described with reference to FIG. 2D for providing a single dimensional transducer. Alternately, the arrangement shown in FIG. 2D can be used to provide a multiple-dimensional transducer. For example, if a first dimension of motion is provided in direction 246, the transducer will provide an output indicative of such motion, as described herein. Similarly, the output signal from array 236 will be indicative of translational position of slits 232 along direction 246 and the rotational position of slits 232 in the plane of the page. As discussed herein, regression, curve fit, and other computations can be used to determine the translational position of slits 232 along array 236. Similarly, well known computations can be executed to determine the angular orientation or slope of slits 232 relative to array 236, wherein this angular orientation or slope provides a second dimension of transducer sensing. Similarly, other multiple-dimensional arrangements can be provided to determine multiple linear dimensions of motion, multiple angular dimensions of motion, and multiple combination linear and angular dimensions of motion.

GENERAL CONSIDERATIONS

Documentation pertinent to the instant application is listed hereinafter and incorporated herein by reference.
1. Photosensor arrays are described in
   a. Product Summary, Solid State Image Sensors by EG&G Reticon of Sunnyvale, CA (1977);
   b. C Series Solid-State Line Scanners 128, 256, 384, 512, 768, 1024 Elements by EG&G Reticon of Sunnyvale, CA (1976);
   c. CCD121H 1728-Element Linear Image Sensor Charge Coupled Device by Fairchild Semiconductor of Mountain View, CA (1976)

d. RC-301, RC-302, and RC-303 Circuit Board Operational and Alignment Procedure, Drawing No. 045-0013 (4 sheets); Schematic Diagram RC302, Drawing No. 011-0169; Schematic Diagram RC303, Drawing No. 011-0164.

2. Disclosure Document No. 088,295 filed on Feb. 19, 1980.

From the above description it will be apparent that there is thus provided a device of the character described possessing the particular features of advantage before enumerated as desirable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A transducer system comprising:
   a first transducer for generating a first transducer number, said first transducer number having a plurality of digital bits;
   a second transducer for generating a second transducer number, said second transducer number having a plurality of digital bits; and
   a stored program digital computer for generating a combined transducer number related to the first transducer number generated with said first transducer and related to the second transducer number generated with said second transducer, said stored program computer including
   (a) memory means for storing a program,
   (b) first input means for receiving the first transducer number from said first transducer under control of the stored program,
   (c) processing means for generating a filter processed first transducer number by filter processing the first transducer number received with said first input means under control of the stored program,
   (d) second input means for receiving the second transducer number from said second transducer under control of the stored program, and
   (e) combining means for generating a combined transducer number under control of the stored program in response to the filter processed first transducer number generated with said processing means and in response to the second transducer number received with said second input means.

2. A transducer system comprising:
   an illumination source for generating source illumination;
   optical means for generating an illumination pattern related to a sensed condition in response to the source illumination generated with said illumination source;
   a charge transfer device having an array of photosensors for generating a sequential plurality of analog transducer signal samples in response to the illumination pattern generated with said optical means;
   an analog to digital converter for generating a sequential plurality of digital transducer signal samples in response to the sequential plurality of analog transducer signal samples generated with said charge transfer device; and
   a digital processor for generating a digital transducer number that is related to the sensed condition by processing the sequential plurality of digital transducer signal samples generated with said analog to digital converter.

3. A transducer system comprising:
   an illumination source for generating source illumination;
   optical means for generating an illumination pattern related to a sensed condition in response to the source illumination generated with said illumination source;
   an array of photosensors for generating transducer signal samples in response to the illumination pattern generated with said optical means; and
   a filter processor for generating output transducer signal samples by filter processing the transducer signal samples generated with said array of photosensors, said filter processor including
   (a) weighting means for generating weighted transducer signal samples by weighting the transducer signal samples generated with said array of photosensors,
   (b) summing means for generating filtered transducer signal samples by summing the weighted transducer signal samples, and
   (c) output means for generating output transducer signal samples in response to the filtered transducer signal samples generated with said summing means.

4. A transducer system comprising:
   illumination means for generating illumination in response to a sensed condition;
   an array of photosensors for generating an array of photosensor signals in response to the illumination generated with said illumination means; and
   a filter processor for generating a filtered transducer signal in response to the array of photosensor signal samples generated by said array of photosensors.

5. The system as set forth in claim 1 above, wherein said first transducer is a vernier transducer for generating the first transducer number as a vernier transducer number having a better resolution than said second transducer number generated with said second transducer.

6. The system as set forth in claim 1 above, wherein said transducer system is a machine control transducer system; wherein said first transducer includes an array of photosensors for generating the first transducer number; wherein the plurality of digital bits of said first transducer number each correspond to a different photosensor in said array of photosensors; wherein said second transducer includes means for generating the second transducer number having the plurality of digital bits arranged as an encoded digital number; wherein said stored program digital computer includes an integrated circuit stored program digital computer for generating the combined transducer number; wherein said memory means includes an integrated circuit read only memory for storing the program; wherein said first input means includes serial means for receiving the first transducer number from said first transducer in serial form under control of the stored program; wherein said processing means includes filter means for generating the filter processed first transducer number by weighting and summing filter processing of the first transducer number under control of the stored program; wherein said second input means includes serial means for receiving the second transducer number from said second transducer in serial form under control of the stored program; wherein said combining means includes means for generating the combined transducer number under control of the stored program by combining the filter processed first transducer number generated with said processing means as the least significant portion of the combined transducer number with the second transducer number received with said second input means as the most significant portion of the combined transducer number.

7. The system as set forth in claim 2 above, wherein said transducer system is an encoder position transducer system; wherein said illumination source includes means for generating the source illumination as collimated source illumination; wherein said optical means includes means for generating the illumination pattern as a line of illumination having a position related to a sensed position condition in response to the source illumination generated with said illumination source; wherein said a charge transfer device includes a two dimensional array of charge coupled device photosensors for generating the sequential plurality of analog transducer signal samples as a shifted sequential plurality of analog transducer signal samples in response to the illumination pattern generated with said optical means; and wherein said digital processor includes a stored program digital computer for generating the digital encoder position transducer number that is related to the sensed position condition by processing the sequential plurality of digital transducer signal samples.

8. The system as set forth in claim 2 above, further comprising:
reference means for generating reference signal samples in response to the sequential plurality of analog transducer signal samples generated with said charge transfer device and
analog refreshing means for refreshing the sequential plurality of analog transducer signal samples generated with said charge transfer device in response to the reference signal samples generated with said reference means to reduce degradation of the sequential plurality of analog transducer signal samples provided to said analog to digital converter.

9. The system as set forth in claim 2 above, wherein said digital processor includes a digital filter processor for generating the digital transducer number as a filtered digital transducer number by filter processing of the sequential plurality of digital transducer signal samples generated with said analog to digital converter.

10. The system as set forth in claim 2 above, wherein said digital processor includes a digital correlation filter processor for generating the digital transducer number as a correlation filtered digital transducer number by correlation processing of the sequential plurality of digital transducer signal samples generated with said analog to digital converter.

11. The system as set forth in claim 2 above, wherein said digital processor includes a digital convolution filter processor for generating the digital transducer number as a convolution filtered digital transducer number by convolution processing of the sequential plurality of digital transducer signal samples generated with said analog to digital converter.

12. The system as set forth in claim 2 above, wherein said digital processor includes a digital transform filter processor for generating the digital transducer number as a transform filtered digital transducer number by transform processing of the sequential plurality of digital transducer signal samples generated with said analog to digital converter.

13. The system as set forth in claim 2 above, wherein said digital processor includes a digital regression filter processor for generating the digital transducer number as a regression filtered digital transducer number by regression processing of the sequential plurality of digital transducer signal samples generated with said analog to digital converter.

14. The system as set forth in claim 2 above, wherein said digital processor includes a digital interpolation processor for generating the digital transducer number as a interpolation filtered digital transducer number by interpolation processing of the sequential plurality of digital transducer signal samples generated with said analog to digital converter.

15. The system as set forth in claim 2 above, wherein said charge transfer device includes a two dimensional array of photosensors and wherein said digital processor includes a two dimensional spacial digital filter processor for generating the digital transducer number as a two dimensionally filtered digital transducer number by two dimensionally filter processing the sequential plurality of digital transducer signal samples generated with said analog to digital converter.

16. The system as set forth in claim 3 above, wherein said transducer system is a velocity transducer system; wherein said illumination source includes a coherent illumination source for generating the source illumination as coherent source illumination; wherein said optical means includes means for generating the illumination pattern as a line illumination pattern related to a sensed velocity condition in response to the coherent source illumination generated with said coherent illumination source; wherein said array of photosensors includes a CCD rectangular array of photosensors for generating analog transducer signal samples in response to the line illumination pattern generated with said optical means; wherein said filter processor includes means for filter processing the analog transducer signal samples generated with said CCD rectangular array of photosensors to generate the output transducer signal samples; wherein said weighting means including a plurality of resistors for generating analog weighted transducer signal samples by weighting the transducer signal samples generated with said array of photosensors; wherein said summing means includes an analog summing circuit for generating analog summed filtered velocity transducer signal samples by summing the weighted transducer signal samples; and wherein said output means includes means for generating output velocity transducer signal samples in response to the analog summed filtered velocity transducer signal samples generated with said summing means.

17. The system as set forth in claim 3 above, further comprising:
reference means for generating reference signal samples in response to the transducer signal samples generated with said array of photosensors and analog refreshing means for refreshing the transducer signal samples in response to the reference signal samples generated with said reference means to reduce degradation of the transducer signal samples processed with said filter processor.

18. A transducer system comprising:
an illumination source for generating source illumination;
optical means for generating an illumination pattern related to a sensed condition in response to the source illumination generated with said illumination source;
an array of photosensors for generating transducer signal samples in response to the illumination pattern generated with said optical means; and
an analog filter processor for generating analog filtered output transducer signal samples by filter processing of the transducer signal samples generated with said array of photosensors, said filter processor including
  (a) weighting means for generating weighted transducer signal samples by weighting the transducer signal samples generated with said array of photosensors,
  (b) summing means for generating filtered transducer signal samples by summing the weighted transducer signal samples, and
  (c) output means for generating the analog filtered output transducer signal samples in response to the filtered transducer signal samples generated with said summing means.

19. A transducer system comprising:
an illumination source for generating source illumination;
optical means for generating an illumination pattern related to a sensed condition in response to the source illumination generated with said illumination source;
an array of photosensors for generating transducer signal samples in response to the illumination pattern generated with said optical means; and
a correlation filter processor for generating correlation filtered output transducer signal samples by correlation processing of the transducer signal samples generated with said array of photosensors, said filter processor including
  (a) weighting means for generating weighted transducer signal samples by weighting the transducer signal samples generated with said array of photosensors,
  (b) summing means for generating filtered transducer signal samples by summing the weighted transducer signal samples, and
  (c) output means for generating the correlation filtered output transducer signal samples in response to the filtered transducer signal samples generated with said summing means.

20. A transducer system comprising:
an illumination source for generating source illumination;
optical means for generating an illumination pattern related to a sensed condition in response to the source illumination generated with said illumination source;
an array of photosensors for generating transducer signal samples in response to the illumination pattern generated with said optical means; and
a convolution filter processor for generating convolution filtered output transducer signal samples by convolution processing of the transducer signal samples generated with said array of photosensors, said filter processor including
  (a) weighting means for generating weighted transducer signal samples by weighting the transducer signal samples generated with said array of photosensors,
  (b) summing means for generating filtered transducer signal samples by summing the weighted transducer signal samples, and
  (c) output means for generating the convolution filtered output transducer signal samples in response to the filtered transducer signal samples generated with said summing means.

21. A transducer system comprising:
an illumination source for generating source illumination;
optical means for generating an illumination pattern related to a sensed condition in response to the source illumination generated with said illumination source;
an array of photosensors for generating transducer signal samples in response to the illumination pattern generated with said optical means; and
a transform filter processor for generating transform filtered output transducer signal samples by transform processing of the transducer signal samples generated with said array of photosensors, said filter processor including
  (a) weighting means for generating weighted transducer signal samples by weighting the transducer signal samples generated with said array of photosensors,
  (b) summing means for generating filtered transducer signal samples by summing the weighted transducer signal samples, and
  (c) output means for generating the transform filtered output transducer signal samples in response to the filtered transducer signal samples generated with said summing means.

22. A transducer system comprising:
an illumination source for generating source illumination;
optical means for generating an illumination pattern related to a sensed condition in response to the source illumination generated with said illumination source;
an array of photosensors for generating transducer signal samples in response to the illumination pattern generated with said optical means; and
a regression filter processor for generating regression filtered output transducer signal samples by regression processing of the transducer signal samples generated with said array of photosensors, said filter processor including
  (a) weighting means for generating weighted transducer signal samples by weighting the transducer signal samples generated with said array of photosensors,
  (b) summing means for generating filtered transducer signal samples by summing the weighted transducer signal samples, and
  (c) output means for generating the regression filtered output transducer signal samples in response to the filtered transducer signal samples generated with said summing means.

23. A transducer system comprising:

an illumination source for generating source illumination;

optical means for generating an illumination pattern related to a sensed condition in response to the source illumination generated with said illumination source;

an array of photosensors for generating transducer signal samples in response to the illumination pattern generated with said optical means; and an interpolation filter processor for generating interpolation processing of the transducer signal samples generated with said array of photosensors, said filter processor including (a) weighting means for generating weighted transducer signal samples by weighting the transducer signal samples generated with said array of photosensors, (b) summing means for generating filtered transducer signal samples by summing the weighted transducer signal samples, and (c) output means for generating the interpolation filtered output transducer signal samples in response to the filtered transducer signal samples generated with said summing means.

24. A position transducer system comprising:

illumination means for generating a line of illumination in response to a sensed position condition;

a two dimensional array of photosensors having a transducer resolution determined by spacing between photosensors for generating an array of photosensor signals in response to the line of illumination generated with said illumination means; and a filter processor for generating a digital position transducer number having a resolution that is better than the transducer resolution determined by the spacing between photosensors by correlation filter processing of the array of photosensor signals.

25. A position transducer system comprising:

illumination means for generating a line of illumination in response to a sensed position condition;

a two dimensional array of photosensors having a transducer resolution determined by the spacing between photosensors for generating an array of photosensor signals in response to the illumination generated with said illumination means; and a filter processor for generating a position digital transducer number having a resolution that is better than the transducer resolution determined by the spacing between photosensors by correlation filter processing the array of photosensor signals.

26. A transducer system comprising:

illumination means for generating illumination in response to a sensed condition;

an array of photosensors for generating an array of photosensor signals in response to the illumination generated with said illumination means; and a correlation filter processor for generating a correlation processed filtered transducer signal by correlation processing of the array of photosensor signals generated with said array of photosensors.

27. A transducer system comprising:

illumination means for generating illumination in response to a sensed condition;

an array of photosensors for generating an array of photosensor signals in response to the illumination generated with said illumination means; and a convolution filter processor for generating a convolution processed filtered transducer signal by convolution processing of the array of photosensor signals generated with said array of photosensors.

28. A transducer system comprising:

illumination means for generating illumination in response to a sensed condition;

an array of photosensors for generating an array of photosensor signals in response to the illumination generated with said illumination means; and a transform filter processor for generating a transform processed filtered transducer signal by transform processing of the array of photosensor signals generated with said array of photosensors.

29. A transducer system comprising:

illumination means for generating illumination in response to a sensed condition;

an array of photosensors for generating an array of photosensor signals in response to the illumination generated with said illumination means; and an interpolation filter processor for generating an interpolation processed filtered transducer signal by interpolation processing of the array of photosensor signals generated with said array of photosensors.

* * * * *